United States Patent [19]
Taguchi et al.

[11] Patent Number: 5,647,932
[45] Date of Patent: Jul. 15, 1997

[54] METHOD OF PROCESSING A PIEZOELECTRIC DEVICE

[75] Inventors: Yutaka Taguchi, Osaka; Kazuo Eda, Nara; Akihiro Kanaboshi, Osaka; Tetsuyoshi Ogura, Osaka; Yoshihiro Tomita, Osaka, all of Japan

[73] Assignee: Matsushita Electric Industrial Co., Ltd., Osaka, Japan

[21] Appl. No.: 601,539

[22] Filed: Feb. 14, 1996

Related U.S. Application Data

[63] Continuation of Ser. No. 245,157, May 17, 1994, abandoned.

[30] Foreign Application Priority Data

May 18, 1993 [JP] Japan ................... 5-115718

[51] Int. Cl.$^6$ ............... H01L 21/30; H01L 21/304; H01L 21/306
[52] U.S. Cl. ............... 156/154; 156/153; 156/155; 156/281; 148/DIG. 12; 148/DIG. 135; 437/225; 437/974
[58] Field of Search .................... 156/281, 153, 156/154, 155, 250; 148/DIG. 12, DIG. 135, DIG. 159; 437/225, 901, 974

[56] References Cited

U.S. PATENT DOCUMENTS

| | | | |
|---|---|---|---|
| 3,123,953 | 3/1964 | Merkl | 29/25.35 X |
| 4,112,147 | 9/1978 | Thompson . | |
| 4,396,895 | 8/1983 | Shimizu et al. . | |
| 4,760,358 | 7/1988 | Inoue . | |
| 4,883,215 | 11/1989 | Goesele et al. | 156/281 X |
| 4,983,251 | 1/1991 | Haisma et al. | 148/DIG. 12 X |
| 5,028,558 | 7/1991 | Haisma | 148/DIG. 12 X |
| 5,160,560 | 11/1992 | Welkowsky et al. | 156/154 |
| 5,169,472 | 12/1992 | Goebel | 156/281 |
| 5,232,870 | 8/1993 | Ito et al. | 148/DIG. 12 X |
| 5,374,581 | 12/1994 | Ichikawa et al. | 148/DIG. 12 X |

FOREIGN PATENT DOCUMENTS

| | | |
|---|---|---|
| 0136050 | 4/1985 | European Pat. Off. . |
| 63-127610 | 5/1988 | Japan . |
| 4-367111 | 12/1992 | Japan . |
| 5-121985 | 5/1993 | Japan . |

OTHER PUBLICATIONS

Haisma, J, et al, "Silicon-on-Insulator Wafer Bonding-Wafer Thinning Technological Evaluations," Japanese Journal of Applied Physics, Aug. 1989, pp. 1426–1443.

*Primary Examiner*—Jeff H. Aftergut
*Attorney, Agent, or Firm*—McDermott, Will & Emery

[57] ABSTRACT

The following steps are performed when processing electronic components such as piezoelectric devices. At Step 1 inter-atom bond is created between a functional member such as a quartz crystal plate and a first substrate, and the functional member and the quartz crystal plate are directly joined together. At Step 2, the functional member and a second substrate are fixed together with an adhesive agent or by a direct bond. At Step 3, the first substrate is removed chemically or mechanically, with said functional member and said second substrate still being joined together. A step of polishing said functional member for the adjustment of thickness thereof may be done between Step 1 and Step 2. For example, a silicon dioxide thin film may be provided between the functional member and the first substrate. Since no adhesive layer exists between the functional member and the first substrate, this improves the degree of plane of the functional member when joined to the first substrate. Therefore, functional member thickness accuracy becomes extremely high and mass productivity is also improved.

24 Claims, 21 Drawing Sheets

CENTER FREQUENCY : 44.1 MHz
SPAN : 100 KHz

CENTER FREQUENCY : 44.5MHz
SPAN : 100KHz

CENTER FREQUENCY : 43.85 MHz
SPAN : 100 KHz

CENTER FREQUENCY : 43.2 MHz
SPAN : 100 KHz

CENTER FREQUENCY: 44.25 MHz

SPAN: 10 MHz

CENTER FREQUENCY: 44.205 MHz
SPAN: 10 MHz

CENTER FREQUENCY: 44.205 MHz
SPAN: 100KHz

CENTER FREQUENCY : 44.527 MHz
SPAN : 100 KHz

CENTER FREQUENCY : 44.026MHz
SPAN : 100KHz

CENTER FREQUENCY : 43.841 MHz
SPAN : 100 KHz

CENTER FREQUENCY : 44.167 MHz

SPAN : 10 MHz

CENTER FREQUENCY : 44.167 MHz
SPAN : 100 KHz

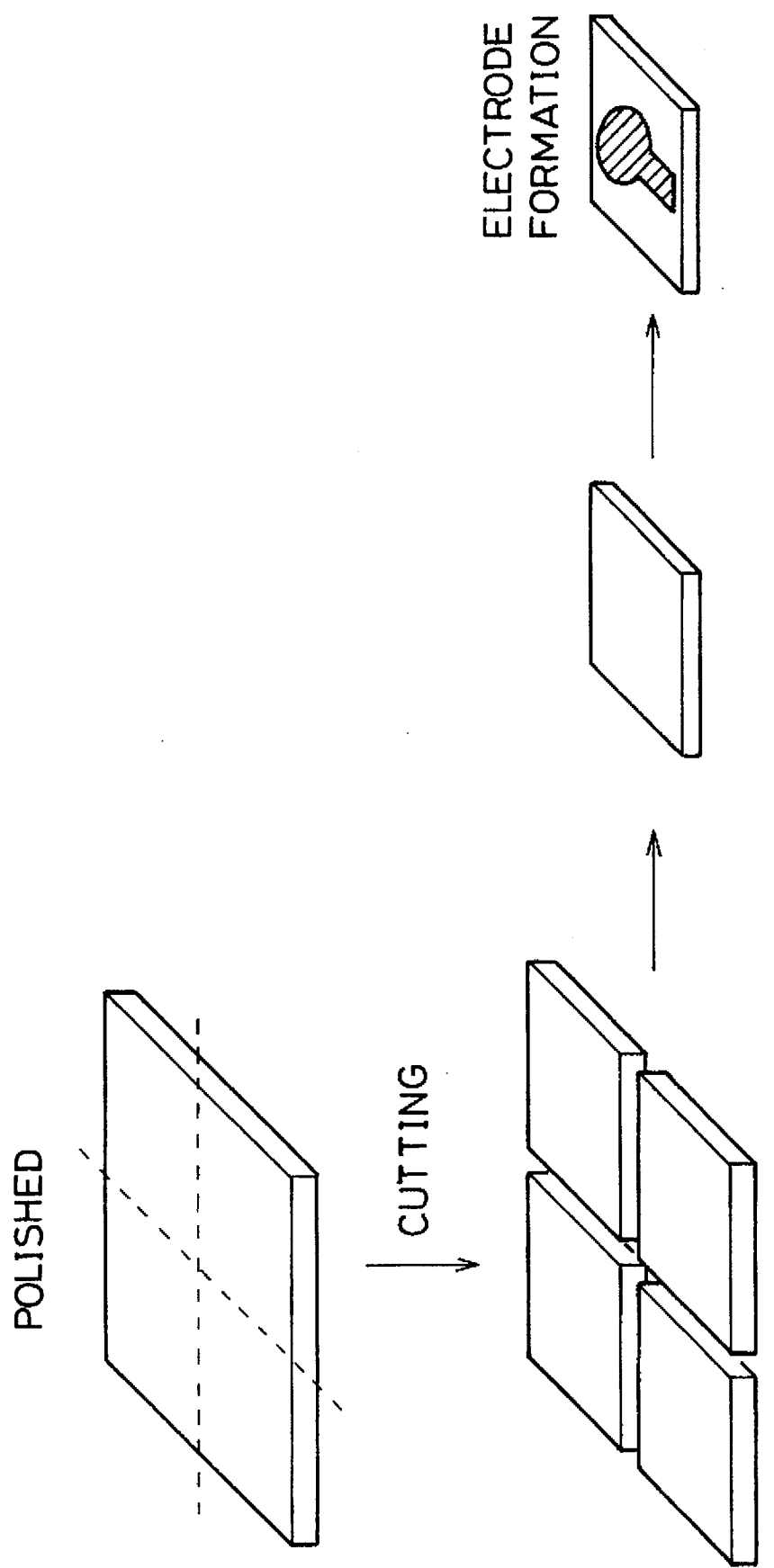

METHOD OF PROCESSING A PIEZOELECTRIC DEVICE

This is a continuation application of application Ser. No. 08/245,157 filed May 17, 1994, now abandoned.

TECHNICAL FIELD OF THE INVENTION

The present invention generally relates to a method of processing electronic components made up of quartz crystal, and particularly to a technique capable of accurately processing and mass-producing electronic components.

BACKGROUND OF THE INVENTION

Piezoelectric devices such as quartz crystal oscillators have been playing an important role in the field of communication because of their high characteristic stability. The advance of communication technology is now creating demands for smaller, high-performance, inexpensive piezoelectric or magnetic devices.

One conventional way of processing a crystal oscillator is described by reference to FIG. 21. In the first place, a quartz crystal is cut at a predefined cut angle. The temperature property of quartz crystal depends upon the cut angle; however, a quartz crystal is usually AT-cut into quartz crystal plates in order to make use of thickness shear mode vibrations. Such a quartz crystal plate is cut into desired dimensions and is polished for the adjustment of thickness. Then, the quartz crystal plate is subjected to an etch treatment to remove a layer suffering damage from such polishing. Electrodes are formed on both sides of the quartz crystal plate, thereafter the process of packaging is carried out.

The processing technique of FIG. 21, however, suffers from some problems. For example, when attempting to thin a quartz crystal plate so as to use a piezoelectric device at a high frequency, the technique of FIG. 21 has difficulties in polishing quartz crystal plates if they are very small. In other words, it is impossible to hold and polish a tiny quartz crystal plate having a thickness of, say, ten odd micrometers without breaking it. A solution to such a problem may be found by changing the order of processing steps. That is, a quartz crystal plate is first polished to an adequate thickness. This is followed by an etching process. Then, the quartz crystal plate is cut. With this solution, the mass productivity may be accomplished. If a finished quartz crystal plate is extremely thin, however, this causes breakage at cutting time.

Japanese Patent Application, published under Pub. No. 4-367111, shows a technique in which a reinforcement member is provided to prevent a quartz crystal plate from breaking. More specifically, this technique shows a metal supporter with springiness that supports a piezoelectric oscillator. In this technique, the oscillation of the piezoelectric oscillator may be checked when it is being held by the metal supporter and thus special attention should be given to the packaging method.

Japanese Patent Application, published under Pub. No. 5-121985, shows another technique. In this technique, a great number of crystal oscillators are fixed to a substrate using an adhesive agent; however, such a packaging technique becomes very difficult to carry out because the size of crystal oscillators decreases with increasing the degree of high-frequency. Generally, the resonant frequency of piezoelectric oscillators is required to be adjusted roughly prior to packaging. This, however, may not applicable to small oscillators because it is not easy to individually handle them during the preparation and adjustment process, thereby creating an obstacle to mass production. Furthermore, the piezoelectric oscillators are held with the aid of an adhesive agent, resulting in poor resistance to heat and vibration.

U.S. Pat. No. 5,036,241, entitled "Piezoelectric Laminate and Method of Manufacture", shows a technique. In this technique, a plate-like piezoelectric body is laminated to a dielectric body using an adhesive agent. The value of the dielectric's resistivity is controlled by means of temperature and light. A voltage is applied to the dielectric body, whereby electric polarization occurs. However, when attempting to process devices based on resonant in the thicknesswise direction of the piezoelectric body, the thickness of an adhesive layer as a result of using the adhesive agent must be controlled precisely because the accuracy of resonant frequency is determined by the accuracy of the piezoelectric body's thickness direction. If a piezoelectric is formed by an AT-cut quartz crystal plate and the center frequency is 100 MHz, the thickness of the piezoelectric will thin down to about 17 µm. In such a case, accuracy of 1 µm or less is required with consideration of the mass productivity and time required for adjustment. Therefore, this technique in which errors in adhesive layer thickness directly contribute to the frequency accuracy may not be practical because it is extremely difficult to control the thickness of the adhesive layer with a high precision.

Other techniques are known in the art. For instance, a paper entitled "Film Bulk Acoustic Wave Resonator Technology" (1990 Ultrasonic Symposium Proceeding, page 529) and U.S. Pat. No. 4,719,383 entitled "Piezoelectric Shear Wave Resonator and Method of Making Same" each show a crystal filter. A crystal filter is formed as follows. A buffer layer of $SiO_2$ is formed on a substrate of silicon or gallium arsenide. Then, a thin film of aluminum nitride or zinc oxide and an electrode are formed to make up a resonator or crystal filter. Piezoelectrics of aluminum nitride or zinc oxide used in this technique can be formed by a thin film technology known in the art as sputtering. Thin films thus formed are polycrystalline, so that, in order to obtain good piezoelectric effects, it is necessary to make the C axis of each crystal grain orient along the normal of the thin film. Such orientation depends on the film process parameters, on the film forming apparatus, on the deposition thickness, and on the substrate material type. Neither quartz, lithium niobate, nor lithium tantalate exhibits good piezoelectricity if they are in the form of a polycrystalline structure. Because of its good stability and thermal property, quartz crystal finds applications in crystal oscillators and filters; however, only α quartz that is a single crystal with a 3-fold rotation axis crystal structure exhibits the piezoelectric effect.

As described above, conventional piezoelectric device processing techniques have difficulties in improving dimensions accuracy that influences high-frequency properties as well as in accomplishing mass production while at the same time maintaining good piezoelectricity. Similar difficulties apply in techniques of processing electronic components such as magnetic devices.

SUMMARY OF THE INVENTION

It is an object of the present invention to provide an improved method of processing a functional member of an electronic component by making use of direct bonding through inter-atom bonding, whereby thickness accuracy which determines the performance of electronic components and mass productivity can be improved.

The present invention discloses a first method of processing an electronic component. The first method comprises the steps of:

(a) joining a functional member and a first substrate together by creating an inter-atom bond between a first flat surface of the functional member and one surface of the first substrate, (b) fixing a second substrate to a second flat surface of the functional member, and (c) removing the first substrate from the first flat surface of the functional member, with the functional member and the second substrate being joined together.

The functional member and the first substrate are directly joined together through inter-atom bonding. Unlike a technique employing adhesive agents for establishing bonding, original plane accuracy of a functional member can be utilized in the present invention, since there is provided nothing causing variations in thickness between the functional member and the first substrate. Therefore, if the flatness of each surface of the functional member is good, a surface of the functional member joined to the first substrate is almost flat. This eliminates the need for a special technique in transferring the functional member onto the second substrate and thus high-accuracy processing can be realized.

The first method may further include a step of adjusting the thickness of the functional member by removing a part of the functional member after the joining step but before the fixing step.

As a result of such arrangement, the flatness of each surface of the functional member before it is transferred to the second substrate becomes very good and thus the functional member can be processed accurately.

In the removing step the first substrate may be removed either by means of mechanical polishing or by means of chemical processings, thereby destroying the first substrate. As a result of such an arrangement, the first substrate can be removed while keeping the degree of plane of the functional member at an adequate level.

In the fixing step the second substrate is fixed to the functional member by creating an inter-atom bond between surfaces of the second substrate and the functional member to be contacted with each other. As a result of such an arrangement, the flatness and thickness accuracy of the functional member can be improved to a further extent.

It is preferable that the functional member is formed by a piezoelectric material. As a result, thickness accuracy can be improved while at the same time keeping the characteristics of high-frequency piezoelectric devices at an adequate level. It is preferable that the piezoelectric material is composed of quartz crystal, lithium tantalate, lithium niobate, lithium borate, lead zirconate titanate (PZT), or lead lanthanum zirconate titanate (PLZT). It is preferable that the first substrate is composed of glass or silicon. This particularly facilitates removal of the first substrate by means of chemical polishing.

It is preferable that the second substrate is composed of the same material as the first substrate. This reduces thermal stress due to differences in thermal expansion coefficient and improves the stability.

It is preferable that the second substrate is composed of quartz crystal, lithium tantalate, lithium niobate, lithium borate, PZT, PLZT, glass, or silicon.

The present invention discloses a second method of processing an electronic component. The second method comprises the steps of:

(a) forming a thin film of uniform thickness either on a first flat surface of a functional member or on a surface of a first substrate, (b) joining the functional member and the first substrate together by creating an inter-atom bond between the first flat surface of the functional member and the surface of the first substrate, one of these surfaces being provided with the thin film, (c) fixing a second substrate to a second flat surface of the functional member, and (d) removing the first substrate from the functional member, with the second substrate being fixed to the functional member.

With the second method, removal of the first substrate becomes easier compared with the first method because of the provision of the thin film between the functional member and the first substrate.

The second method may further include a step of adjusting the thickness of the functional member by removing a part of the functional member after the joining step but before the fixing step.

In the removing step the first substrate can be removed either by means of mechanical polishing or by means of chemical processing. The thin film is removed by means of etching, which facilitates removal of the first substrate.

In the fixing step the second substrate is fixed to the functional member by creating an inter-atom bond between surfaces of the second substrate and the functional member to be contacted with each other. This improves the flatness and thickness accuracy of the functional member to a further extent.

The second method may utilize the same materials for the functional member, the first substrate, and the second substrate as the first method.

In the second method, the thin film is formed by silicon or silicon dioxide. Because of this, removal of the thin film can be done easily, thereby facilitating removal of the first substrate.

Bonding making use of inter-atom bonding in the first and second methods is realized by first subjecting surfaces being contacted with each other to a hydrophilicitization treatment for adhesion, and then to a high-temperature treatment or to a UV (ultraviolet) illumination.

If the first and second methods further include a step of performing electronic components subdivision with the functional member and the second substrate being joined together, after all the steps have been completed, this improves the mass productivity of electronic components.

BRIEF DESCRIPTION OF THE DRAWINGS

In the drawings in which:

FIG. 21 illustrates successive stages of the processing of a conventional piezoelectric device.

PREFERRED EMBODIMENTS OF THE INVENTION

EXAMPLE 1

Figure 1:
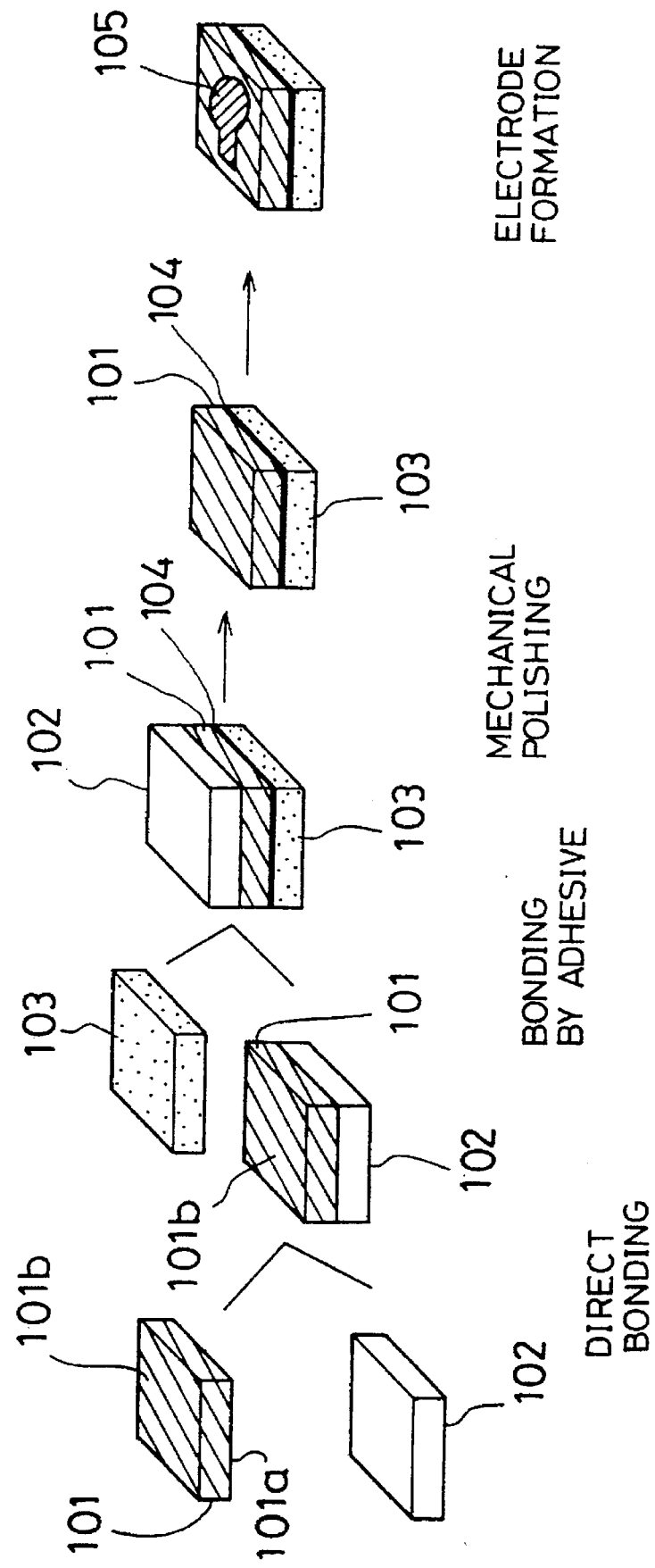
FIG. 1 shows successive stages of the processing of a crystal oscillator of a first embodiment of the present invention.
Figure 2:
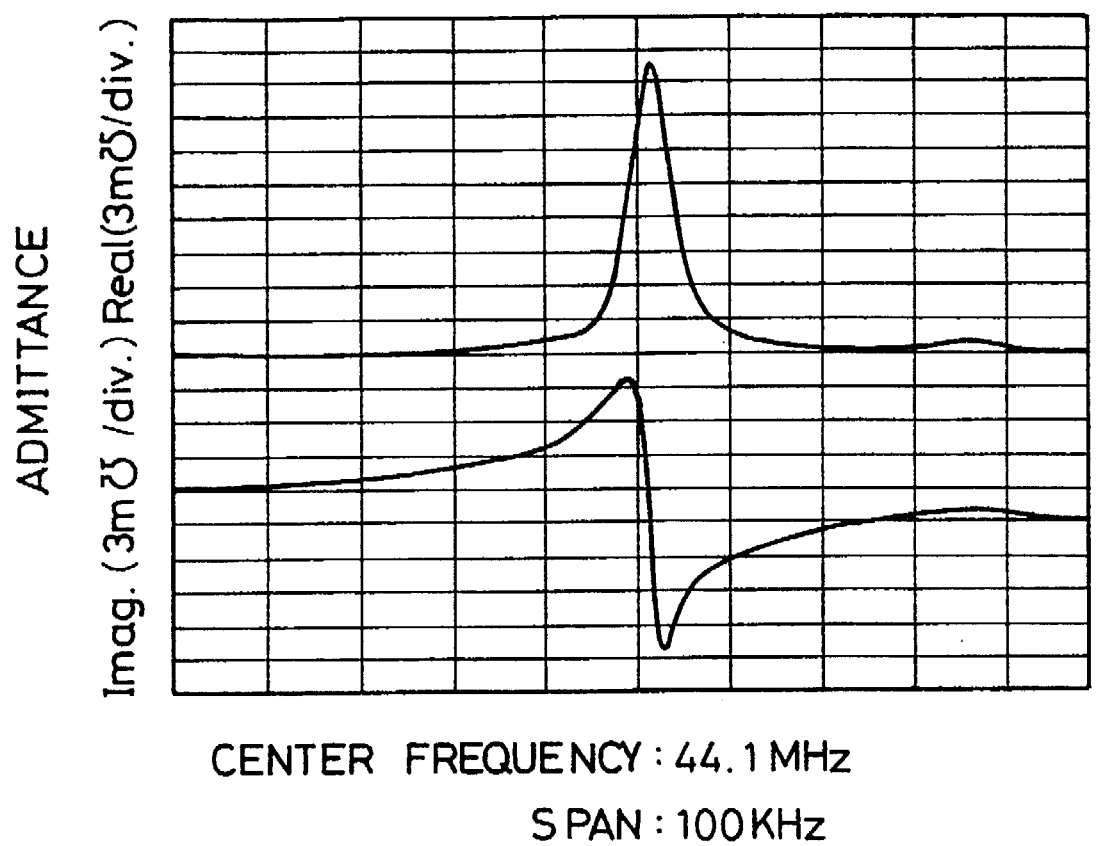
FIG. 2 is a graph showing the electric characteristic of crystal oscillators of the first embodiment.

A first embodiment of the present invention is described by making reference to FIGS. 1 and 2. In this example, a piezoelectric AT-cut quartz crystal plate 101 serving as a functional member, a first glass substrate 102 (i.e. the first substrate), and a second glass substrate 103 (i.e., the second substrate) were used. Firstly, both the quartz crystal plate 101 and the first glass substrate 102 were subjected to a treatment using a hydrophilicitization solution; in other words they were made to become hydrophilic. A first-flat surface 101a of the quartz crystal plate 101 and one surface of the first glass substrate 102 were brought in contact with each other. Inter-atom bonding was created between the crystal plate 101 and the first glass substrate 102 and they were directly joined together. By "being directly joined", what is meant is such bonding as performed by the following process. That is, surfaces of two members being joined together are polished to such an extent that these surfaces become sufficiently flat and smooth, and thereafter they are subjected to a hydrophilicitization treatment for attachment of hydroxyl groups to the surfaces of the members. Thereafter, these surfaces are lapped one over the other and are subjected to a heat treatment, as a result of which the degree of bonding changes from a weak hydrogen bond to a strong covalent bond. This permits the members to join together by means of atom-level bonding, without relying on any adhesive.

After the above-described direct bonding, the quartz crystal plate 101 was polished, from the opposite surface of the first flat surface 101a (i.e., from the side of a second flat surface 101b), to adjust the thickness of the quartz crystal plate 101.

Next, the second flat surface 101b of the quartz crystal plate 101 and one surface of the second glass substrate 103 were firmly fixed together using an adhesive agent. This produced an adhesive agent layer 104 between the quartz crystal plate 101 and the second glass substrate 103. FIG. 1 shows this in an upside-down manner so that the first glass substrate 102 comes to the top. The first glass substrate 102 was mechanically polished and removed from over the quartz crystal plate 101. In other words, the quartz crystal plate 101 was "transferred" from the first glass substrate 102 to the second glass substrate 103.

Thereafter, an opening was formed from the underside of the second glass substrate 103 using an etching solution capable of dissolving glass but almost incapable of dissolving quartz crystal (i.e., buffered hydrofluoric acid) so as to form electrodes 105 on each surface of the quartz crystal plate 101.

FIG. 2 shows the electric characteristic of a crystal oscillator formed in the above-described way. As seen from FIG. 2, there was found little or no difference in the electric characteristic between a conventionally formed crystal oscillator and one formed according to the present embodiment. In other words, it was found that the above-described transfer processing based on direct bonding did not damage piezoelectricity.

EXAMPLE 2

Figure 3:
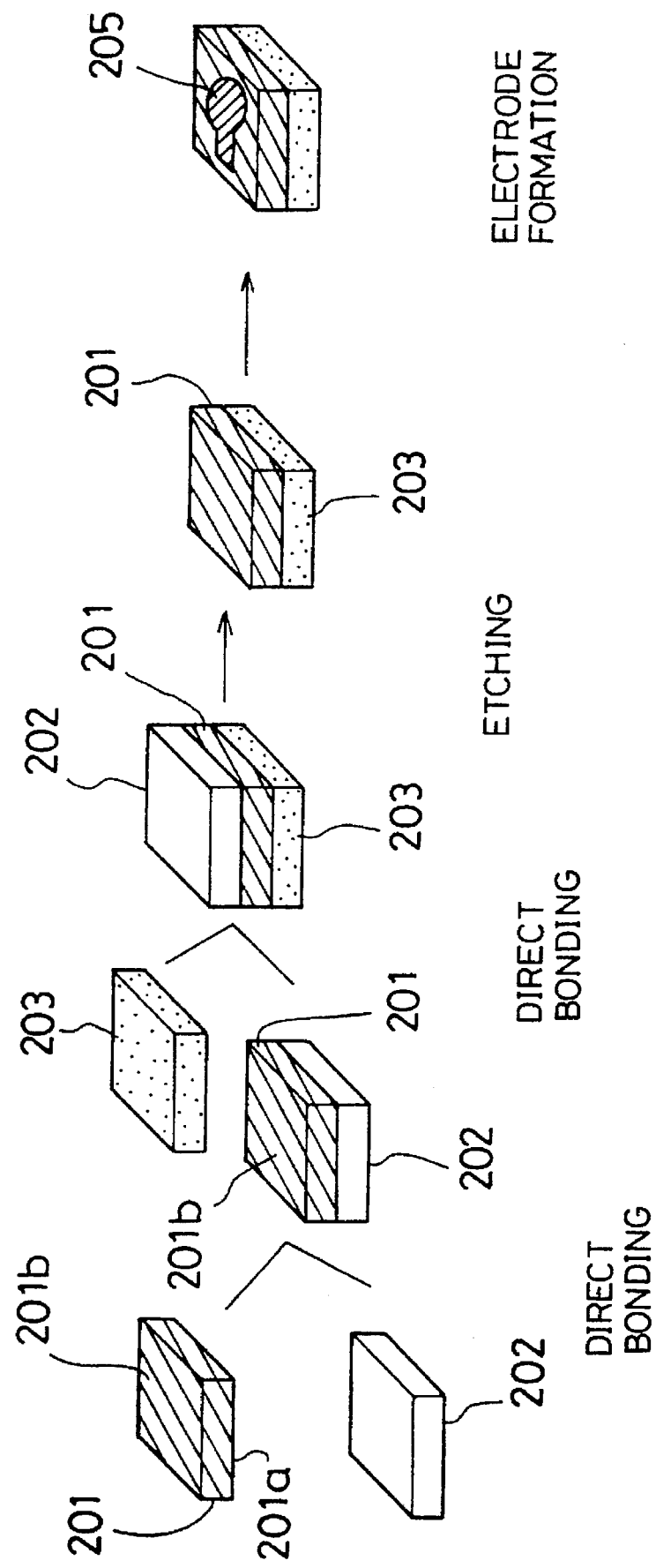
FIG. 3 shows successive stages of the processing of a crystal oscillator of a second embodiment of the present invention.
Figure 4:
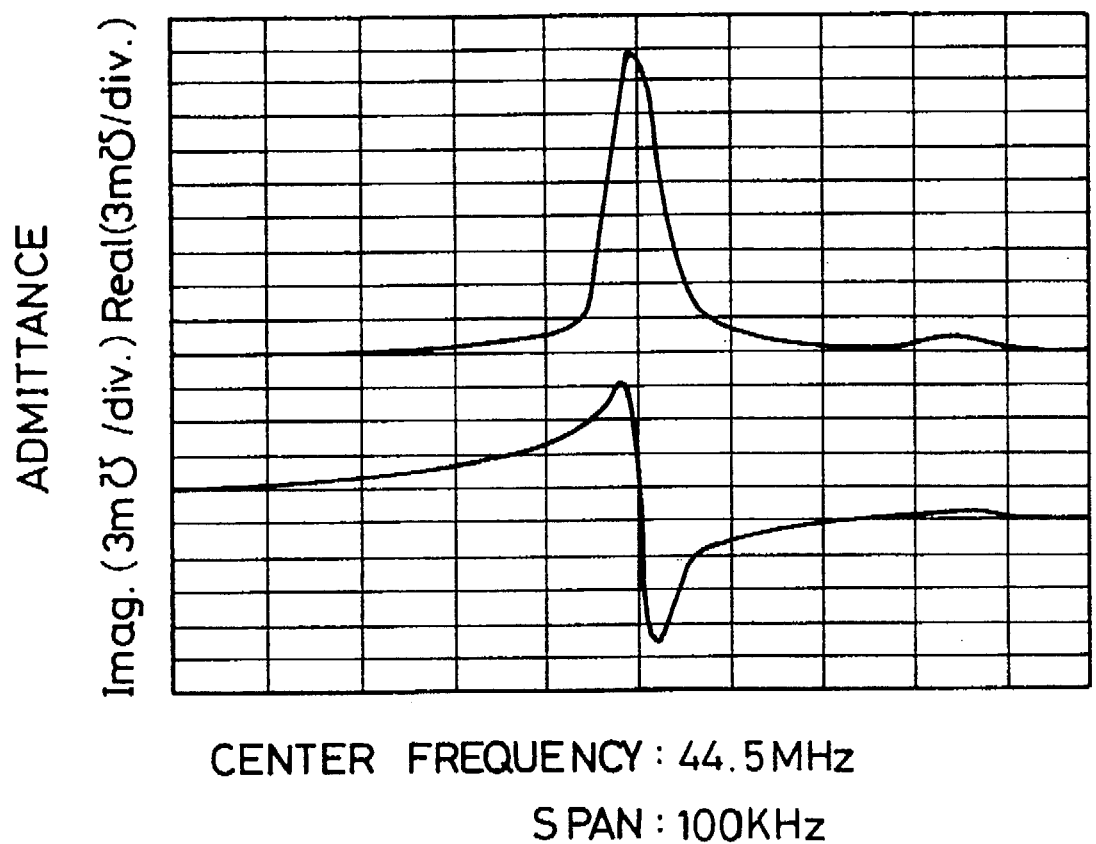
FIG. 4 is a graph showing the electric characteristic of crystal oscillators of the second embodiment.

A second embodiment of the invention is described by making reference to FIGS. 3 and 4. In the second embodiment, an AT-cut quartz crystal plate 201 serving as a functional member, a glass substrate 202 (i.e., the first substrate) and a silicon substrate 203 (i.e., the second substrate) were used. In the first place the quartz crystal plate 201 and the glass substrate 202 were subjected to a hydrophilicitization treatment, and inter-atom bonding was created between a first flat surface 201a of the quartz crystal plate 201 and one surface of the glass substrate 202 by a heat treatment. As a result, the quartz crystal plate 201 and the glass substrate 202 were directly joined together. Next, in order to adjust the thickness of the quartz crystal plate 201, the quartz crystal plate 201 was polished from a second flat surface 201b thereof. This was followed by direct inter-atom bonding of the quartz crystal plate 201 and the silicon substrate 203.

An opening was pre-formed, such as by chemical processing (e.g., etching) or by mechanical processing (e.g., sandblasting), in the silicon substrate 203 where electrodes were to be formed. FIG. 3 shows this upside down so that the glass substrate 202 comes to the top. After the quartz crystal plate 201 and the silicon substrate 203 were joined together, the glass substrate 202 was etched away using an etchant solution capable of dissolving glass but incapable of dissolving quartz or silicon (e.g., buffered hydrofluoric acid). Then, electrodes were formed on each surface of the quartz crystal plate 201 to form a crystal oscillator. FIG. 4 shows the electric characteristic of a crystal oscillator in accordance with the present embodiment. As seen from FIG. 4, there was found little or no difference in the electric characteristic between a conventionally formed crystal oscillator and one fabricated according to the present embodiment.

EXAMPLE 3

Figure 5:
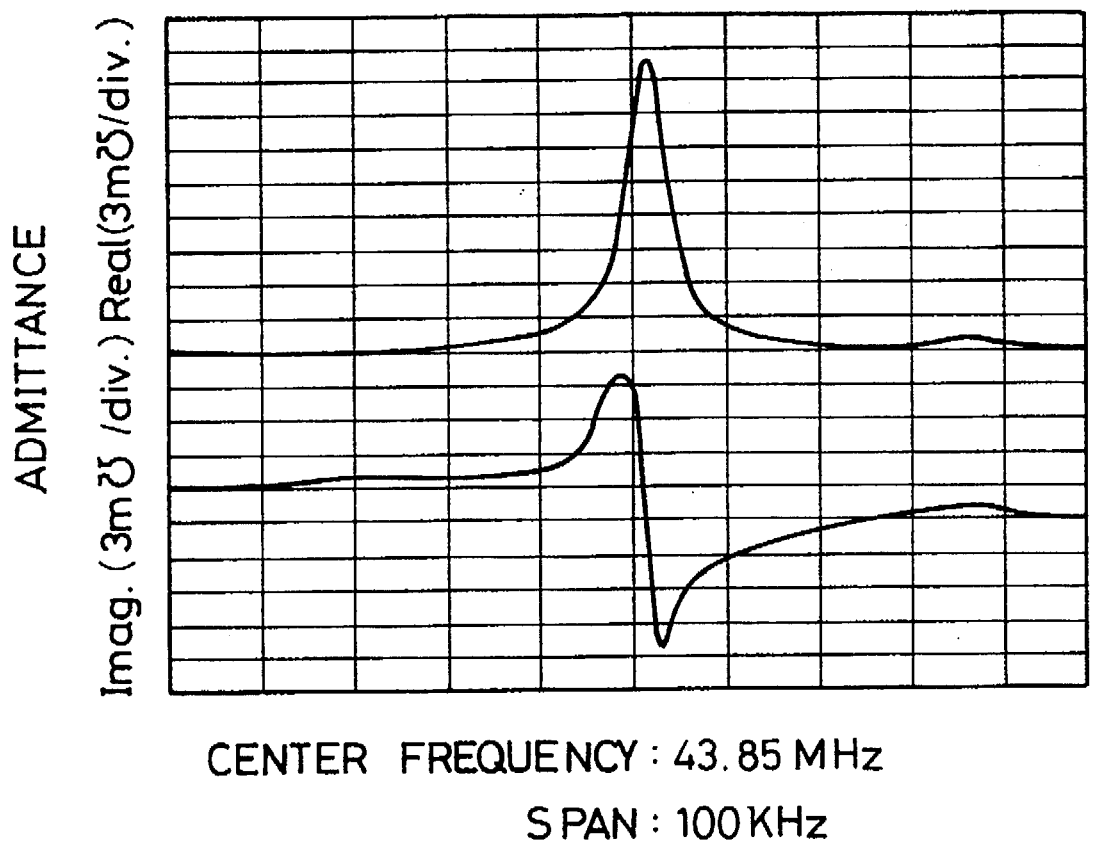
FIG. 5 is a graph showing the electric characteristic of crystal oscillators of a third embodiment of the present invention.

In a third embodiment of the present invention, an AT-cut quartz crystal plate serving as a functional member, a silicon substrate (i.e., the first substrate) and a glass substrate (i.e., the second substrate) were used. Processing stages of the present embodiment are nearly the same as the first embodiment (see FIG. 1) and thus they are not schematically explained here. In the first place, the quartz crystal plate and the silicon substrate were directly joined together through inter-atom bonding, and the glass substrate was adhered to the crystal plate using an adhesive agent. Then, the silicon substrate was removed by means of mechanical polishing. Finally, electrodes were formed on each surface of the quartz crystal plate to form a crystal oscillator. FIG. 5 shows the electric characteristic of crystal oscillators according to the present embodiment. As seen from FIG. 5, there was found little or no difference in the electric characteristic between a conventionally formed crystal oscillator and a present crystal oscillator.

EXAMPLE 4

Figure 6:
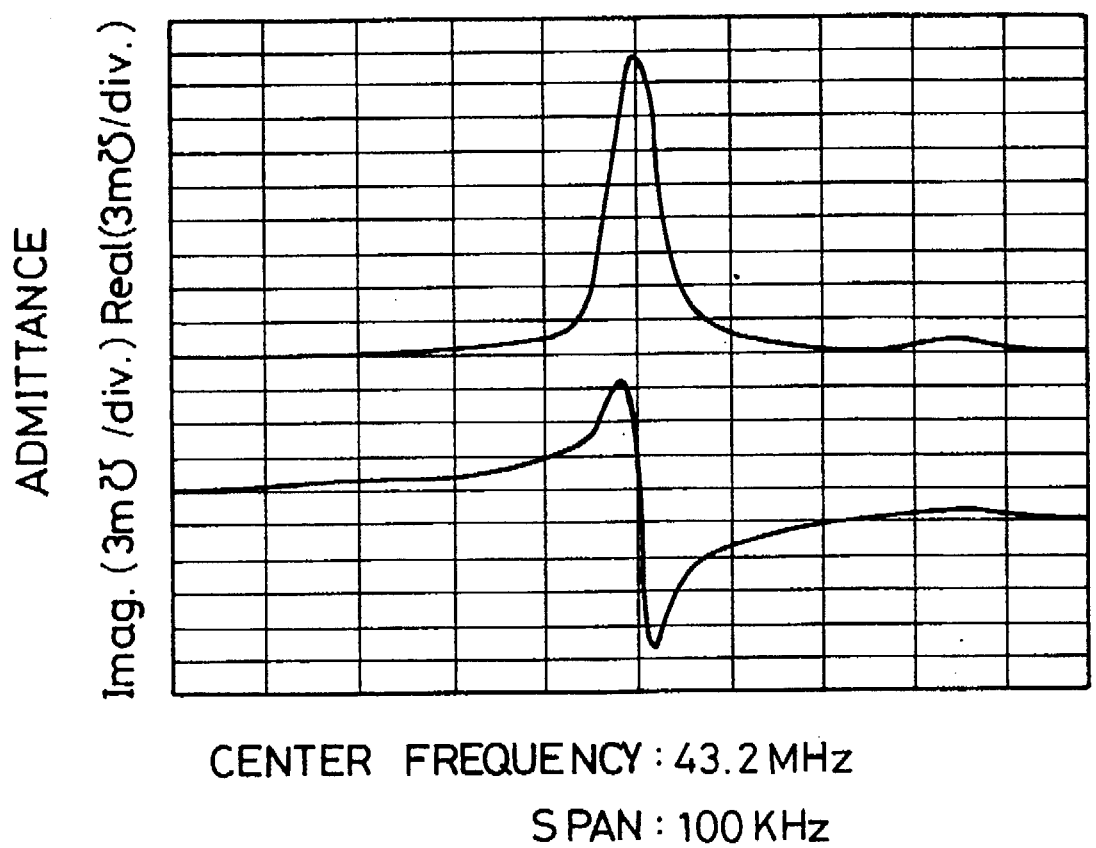
FIG. 6 is a graph showing the electric characteristic of crystal oscillators of a fourth embodiment of the present invention.

In a fourth embodiment of the invention, an AT-cut quartz crystal plate which is a functional member, a first silicon substrate (i.e., the first substrate) and a second silicon substrate (i.e., the second substrate) were used. Processing stages of the present embodiment are the same as the second embodiment (see FIG. 3) and thus they are not schematically explained here. In the first place, the quartz crystal plate and the first silicon substrate were directly joined together through inter-atom bonding, and the quartz crystal plate and the second silicon substrate were directly joined together through inter-atom bonding. Then, the first silicon substrate was removed by means of etching. Finally, electrodes were formed on each surface of the quartz crystal plate to form a crystal oscillator. FIG. 6 shows the electric characteristic of crystal oscillators according to the present embodiment. As seen from FIG. 6, there was found little or no difference in the electric characteristic between a conventionally formed crystal oscillator and one formed according to the present embodiment.

EXAMPLE 5

Figure 7:
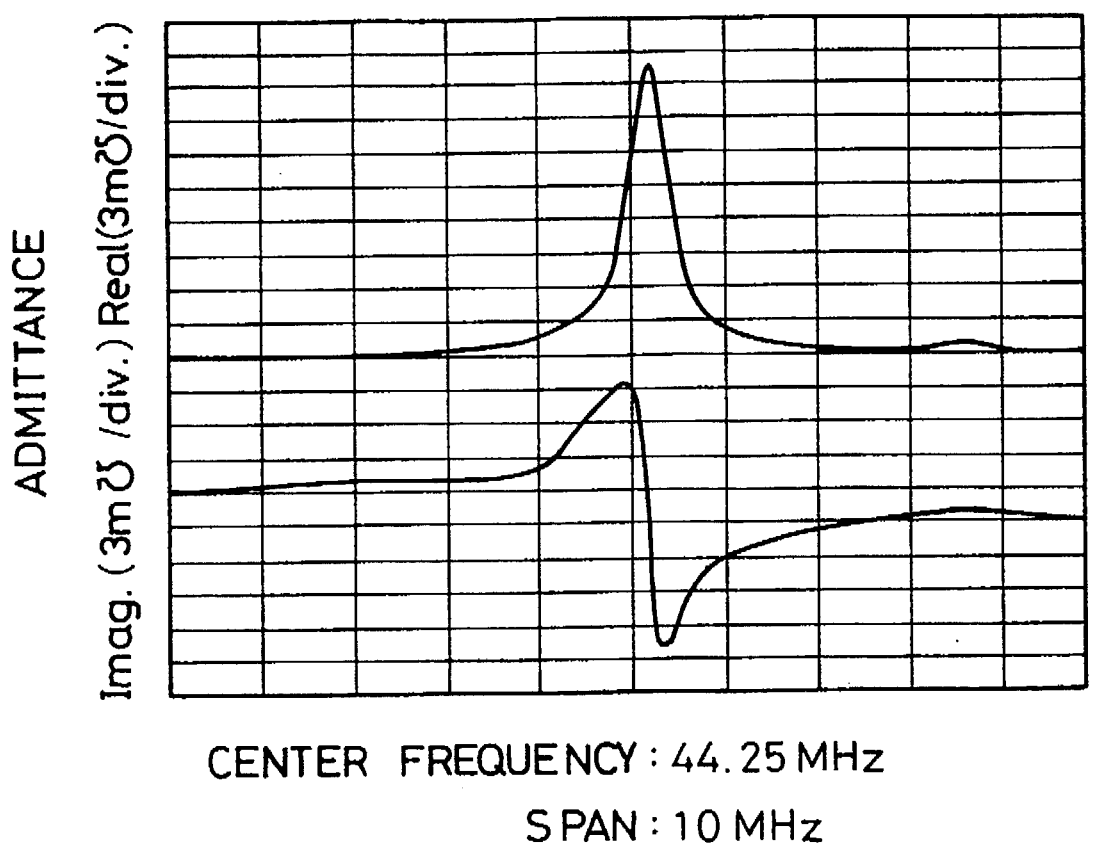
FIG. 7 is a graph showing the electric characteristic of lithium tantalate oscillators of a fifth embodiment of the present invention.

In a fifth embodiment of the invention, a Z-cut lithium tantalate plate which is a functional member, a first silicon substrate (i.e. the first substrate), and a second silicon substrate (i.e., the second substrate) were used. Processing stages of the present embodiment are the same as the second embodiment (see FIG. 3) and thus they are not schematically explained here. In the first place, the lithium tantalate plate and the first silicon substrate were directly joined together through inter-atom bonding, and the lithium tantalate plate and the second silicon substrate were directly joined together through inter-atom bonding. Then, the first silicon substrate was etched away using an etchant (e.g., buffered hydrofluoric acid). Finally, electrodes were formed on each surface of the lithium tantalate plate to form an oscillator. FIG. 7 shows the electric characteristic of lithium tantalate oscillators according to the present embodiment. As seen from FIG. 7, there was found little or no difference in the electric characteristic between a conventionally formed lithium tantalate oscillator and one formed according to the present embodiment.

EXAMPLE 6

Figure 8:
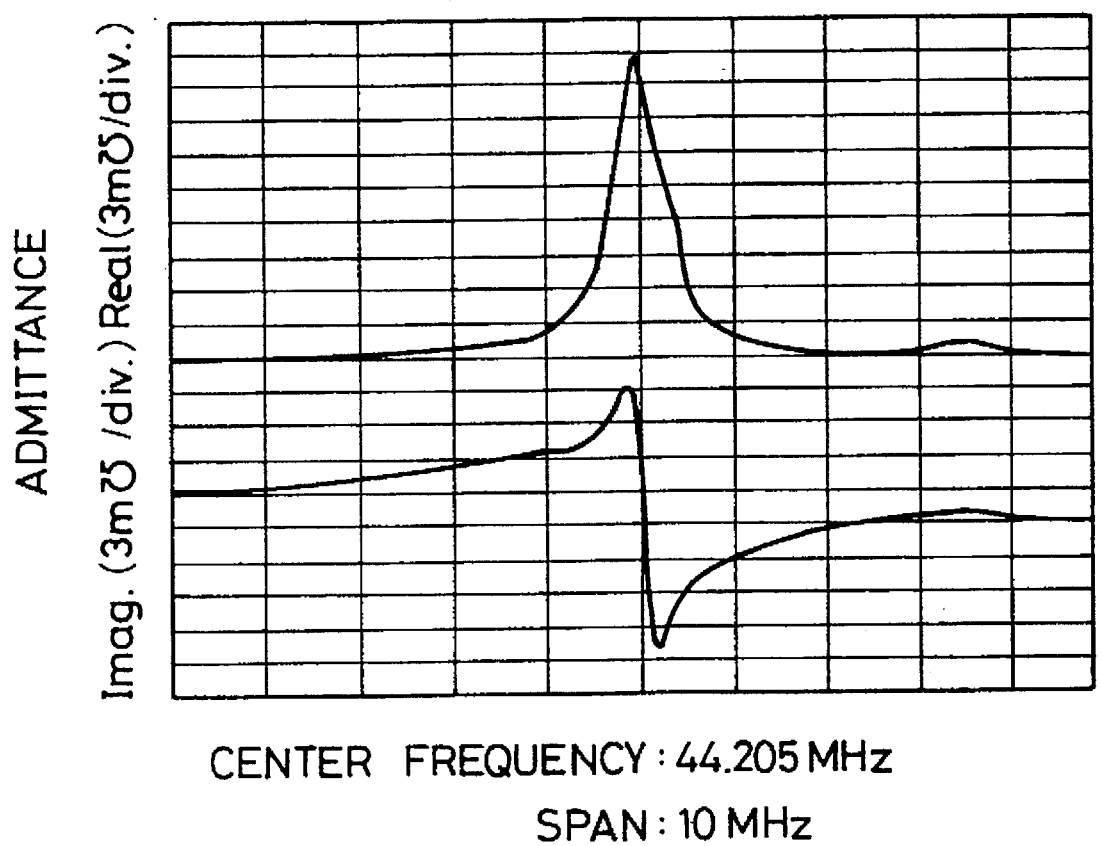
FIG. 8 is a graph showing the electric characteristic of lithium niobate oscillators of a sixth embodiment of the present invention.

In a sixth embodiment of the invention, an X-cut lithium niobate plate which is a functional member, a glass substrate (i.e., the first substrate) and a lithium niobate substrate (i.e., the second substrate) were used. Processing stages of the present embodiment are the same as the second embodiment (see FIG. 3) and thus they are not schematically explained here. In the first place, the lithium niobate plate and the glass substrate were directly joined together through inter-atom bonding, and the lithium niobate plate and the lithium niobate substrate were joined together through inter-atom bonding. Then, the glass substrate was etched away using an etchant (e.g., buffered hydrofluoric acid). Finally, electrodes were formed on each surface of the lithium niobate plate to form an oscillator. FIG. 8 shows the electric characteristic of lithium niobate oscillators according to the present embodiment. As seen from FIG. 8, there was found little or no difference in the electric characteristic between a conventionally formed lithium niobate oscillator and one formed according to the present embodiment.

EXAMPLE 7

Figure 9:
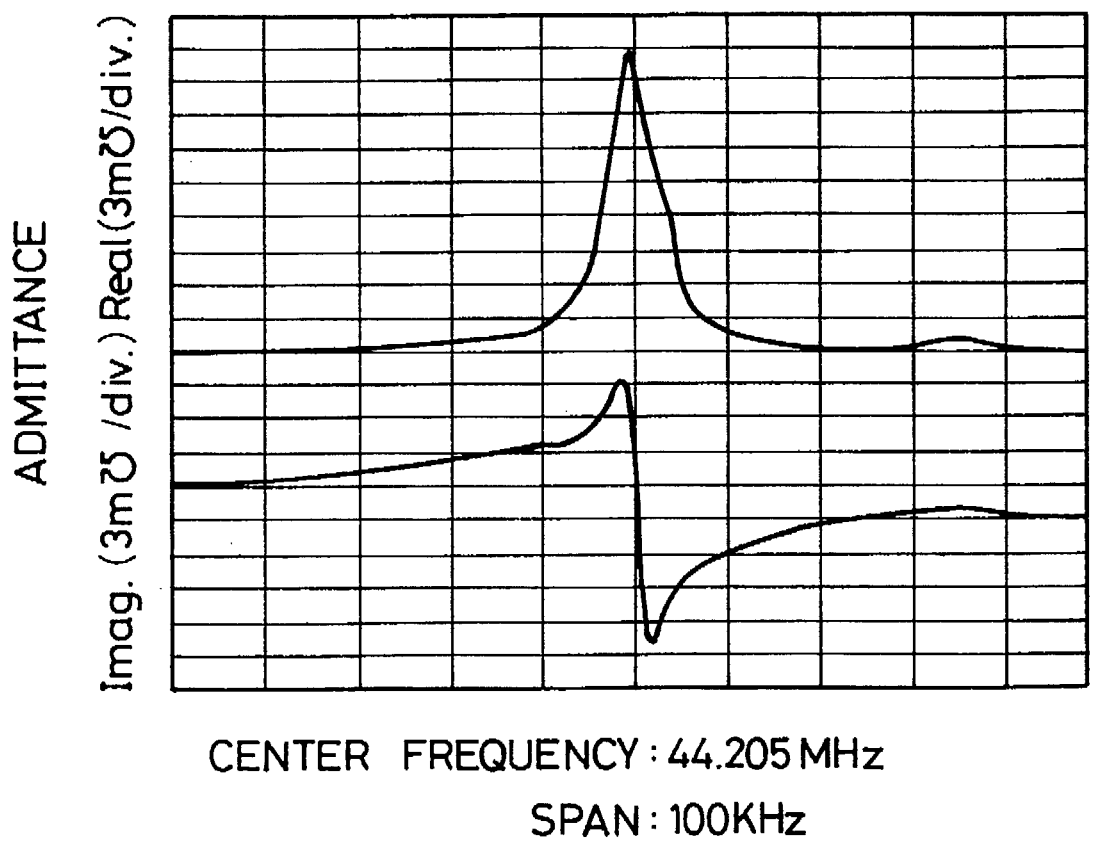
FIG. 9 is a graph showing the electric characteristic of crystal oscillators of a seventh embodiment of the present invention.

In a seventh embodiment of the invention, an AT-cut quartz crystal plate which is a functional member, a silicon substrate (i.e., the first substrate) and a quartz crystal substrate (i.e., the second substrate) were used. Processing stages of the present embodiment are the same as the second embodiment (see FIG. 3) and thus they are not schematically explained here. In the first place, the AT-cut quartz crystal plate and the silicon substrate were directly joined together through inter-atom bonding, and the AT-cut quartz crystal plate and the quartz crystal substrate were directly joined together through inter-atom bonding. Then, the silicon substrate was removed by means of etching. Finally, electrodes were formed on each surface of the AT-cut quartz crystal plate to form a crystal oscillator. FIG. 9 shows the electric characteristic of crystal oscillators according to the present embodiment. As seen from FIG. 9, there was found little or no difference in the electric characteristic between a conventionally formed crystal oscillator and a present crystal oscillator.

In each of the first to seventh embodiments of the invention, quartz crystal, lithium tantalate, lithium niobate are used to form a functional member. Other functionally equivalent materials may be useful, such as piezoelectric substances (e.g., lithium borate, PZT, and PLZT) and magnetic substances (e.g., ferrite). Further, quartz crystal, silicon, and glass are used to form substrates. Other functionally equivalent materials may be useful, for example, different types of ceramics. The foregoing material combinations are not to be considered restrictive. Any other material combination may be useful.

EXAMPLE 8

Figure 10:
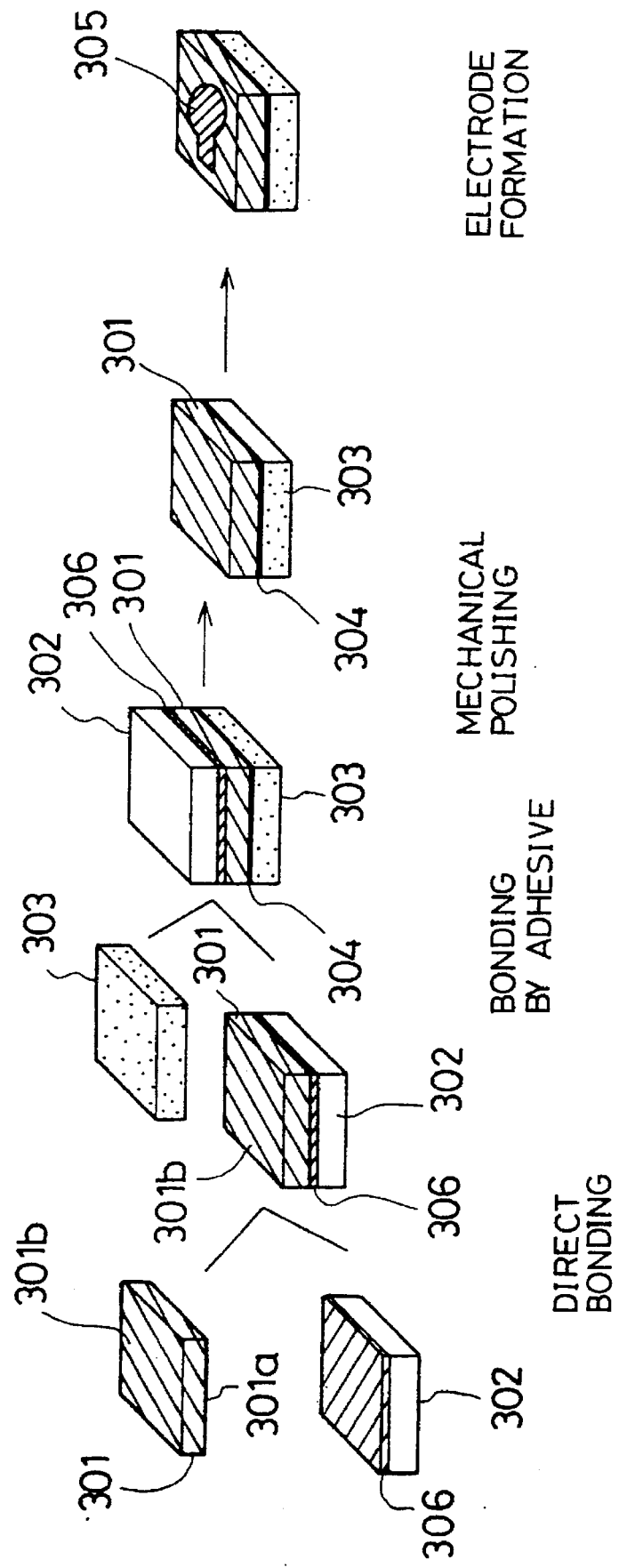
FIG. 10 shows successive stages of the processing of crystal oscillators of an eighth embodiment of the present invention.
Figure 11:
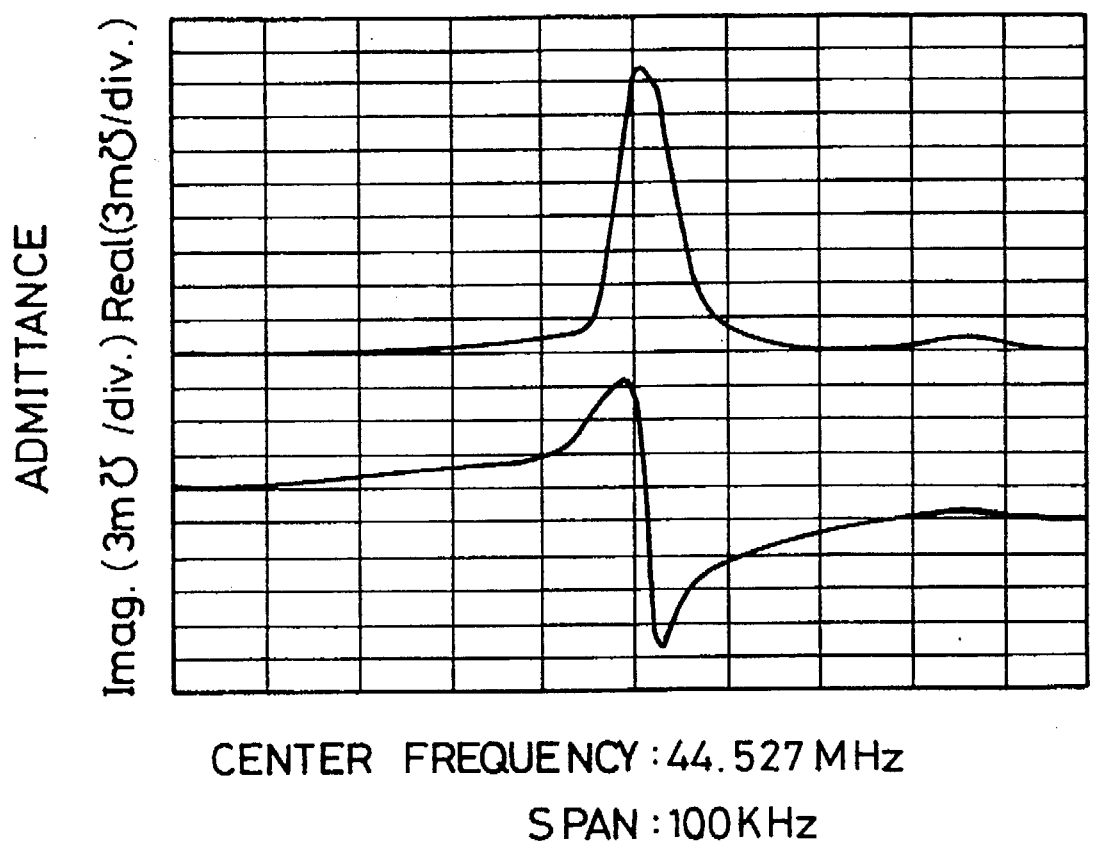
FIG. 11 is a graph showing the electric characteristic of crystal oscillators of the eighth embodiment.

Referring now to FIGS. 10 and 11, an eighth embodiment of the invention is described. In the eighth embodiment, an AT-cut quartz crystal plate 301 which is a functional member and which exhibits the piezoelectric effect, a first glass substrate 302 (i.e., the first substrate) and a second glass substrate 303 (i.e., the second substrate) were used. In the first place, a silicon thin film 306 was deposited 0.5 µm on one surface of the first glass substrate 302 by means of a CVD process. This was followed by subjecting the quartz crystal plate 301 and the first glass substrate 302 with the silicon thin film 306 thereon to a hydrophilicitization treatment. This hydrophilicitization treatment caused inter-atom bonding between a first flat surface 301a of the quartz crystal plate 301 and the silicon thin film 306, and the quartz crystal plate 301 and the first glass substrate 302 were directly joined together. Next, the second glass substrate 303 was firmly fixed to a second flat surface 301b of the quartz crystal plate 301 with an adhesive agent, which, as a result, produced an adhesive layer 304 between the quartz crystal plate 301 and the second glass substrate 303. Thereafter, the first glass substrate 302 was removed by means of mechanical polishing. An opening was formed from the underside of the second glass substrate 302 using an etchant capable of dissolving glass but almost incapable of dissolving quartz (e.g., buffered hydrofluoric acid) so that electrodes 305 were formed on each surface of the quartz crystal plate 301.

FIG. 11 shows the electric characteristic of crystal oscillators formed in the above-described way. There was found little or no difference in the electric characteristic between a conventionally formed crystal oscillator and one formed according to the present embodiment.

In the present embodiment, the silicon thin film 306 is disposed between the quartz crystal plate 301 and the first glass substrate 302. This facilitates removal of the first glass substrate 302 from the quartz crystal plate 301.

EXAMPLE 9

Figure 12:
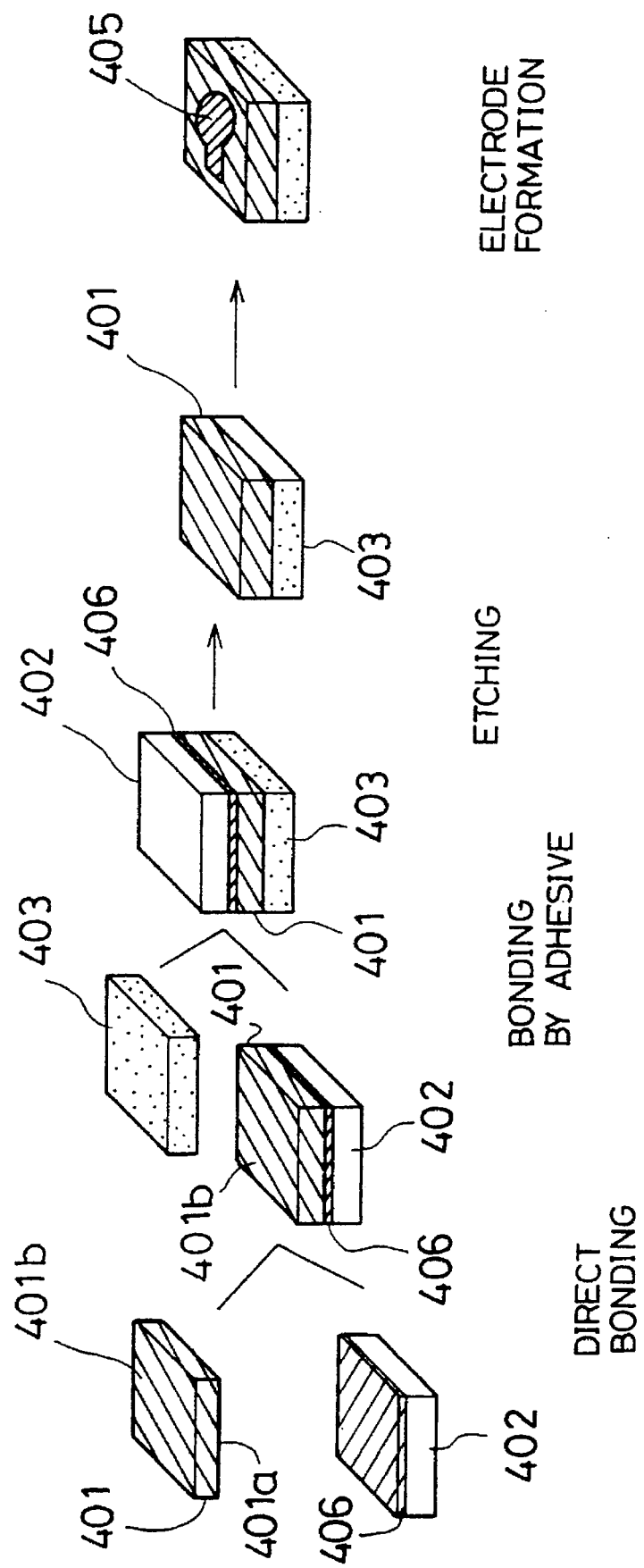
FIG. 12 shows successive stages of the processing of crystal oscillators of a ninth embodiment of the present invention.
Figure 13:
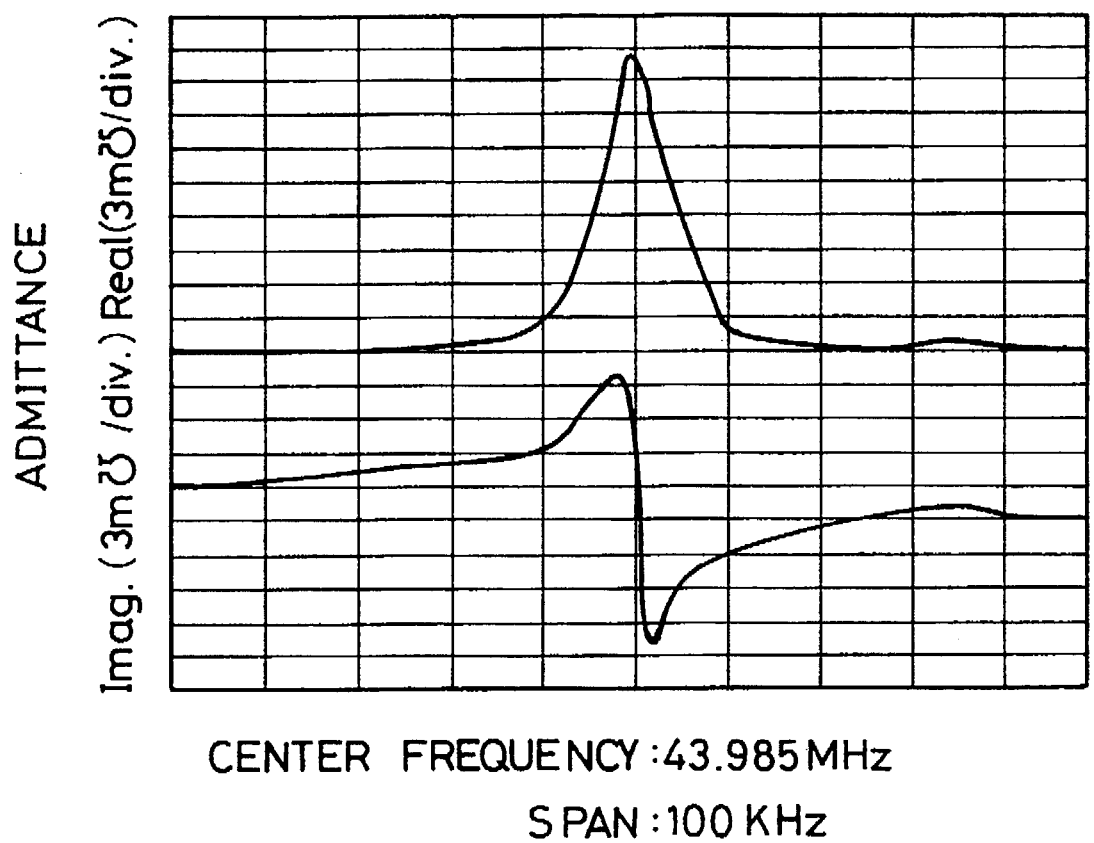
FIG. 13 is a graph showing the electric characteristic of crystal oscillators of the ninth embodiment.

Referring now to FIG. 12, a ninth embodiment of the invention is described. In the ninth embodiment, an AT-cut quartz crystal plate 401 which is a functional member, a glass substrate 402 (i.e., the first substrate) and a silicon substrate 403 (i.e., the second substrate) were used. In the first place, a silicon thin film 406 was deposited 0.5 µm on one surface of the glass substrate 402 by means of a CVD process. This was followed by subjecting the quartz crystal plate 401 and the glass substrate 402 with the silicon thin film 406 thereon to a hydrophilicitization treatment. This hydrophilicitization treatment caused inter-atom bonding between a first flat surface 401a of the quartz crystal plate 401 and the silicon thin film 406 of the glass substrate 402, and the quartz crystal plate 401 and the glass substrate 402 were directly joined together. The quartz crystal plate 401 was polished for thickness adjustment, and inter-atom bonding was created between a second flat surface 401b of the quartz crystal plate 401 and one surface of the silicon substrate 403, and the crystal plate 401 and the silicon substrate 403 were directly bonded together. Thereafter, an etchant capable of dissolving silicon but incapable of dissolving quartz (e.g., hydrofluoric acid) was used to etch the silicon thin film 406, and the glass substrate 402 was removed. A portion of the silicon substrate 403 corresponding to an underside electrode of a piezoelectric was etched. Electrodes 405 were formed on each surface of the quartz crystal plate 401. FIG. 13 shows the electric characteristic of crystal oscillators formed in the above-described way. There was found little or no difference in the electric characteristic between a conventionally formed crystal oscillator and one formed according to the present embodiment.

EXAMPLE 10

Figure 14:
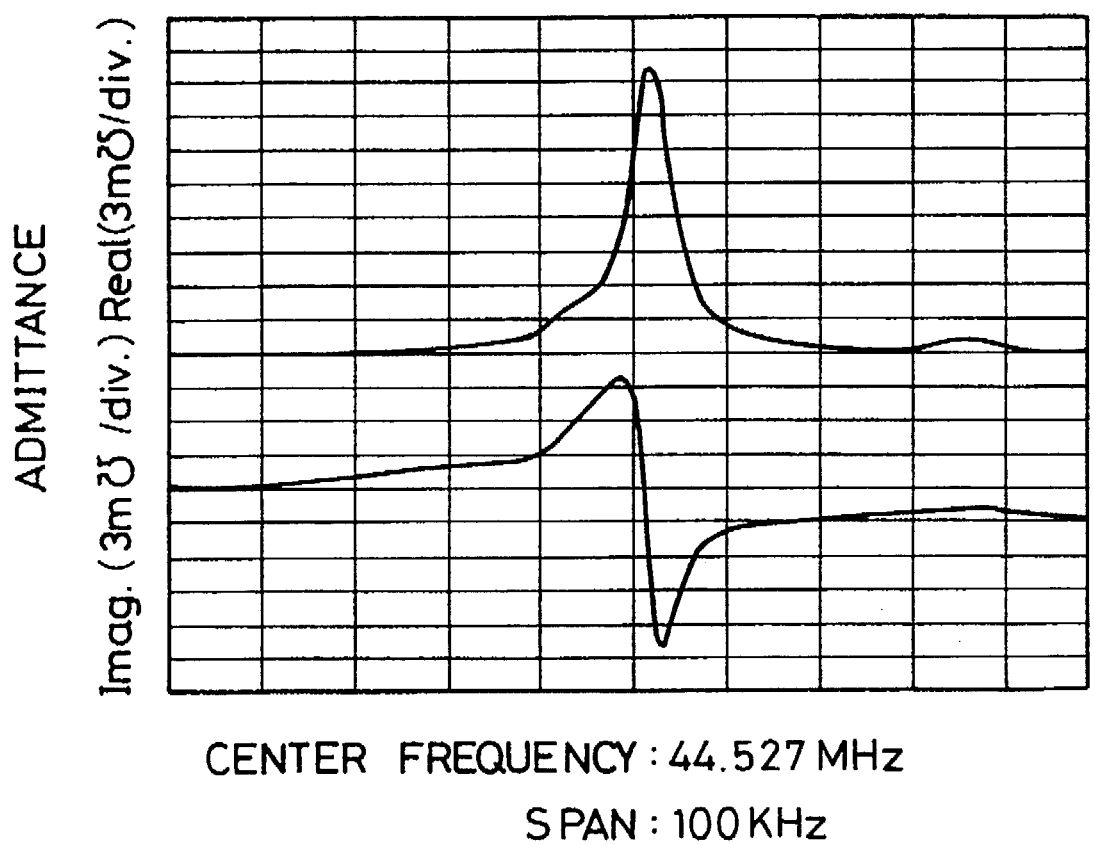
FIG. 14 is a graph showing the electric characteristic of crystal oscillators of a tenth embodiment of the present invention.

A tenth embodiment of the invention is described. An AT-cut quartz crystal plate as a functional member and a first silicon substrate (i.e., the first substrate) and a second silicon substrate (i.e., the second substrate) were used. Processing stages of the tenth embodiment are almost the same as the ninth embodiment (see FIG. 12) and thus they are not schematically explained here. Firstly, a silicon thin film having a thickness of 0.5 µm was formed on the first silicon substrate. Then, the quartz crystal plate and the silicon thin film of the first silicon substrate were directly joined together through inter-atom bonding. Thereafter, the quartz crystal plate was adjusted in thickness, and the second silicon substrate and the quartz crystal plate were directly joined together through inter-atom bonding. Then, the first silicon substrate, along with the silicon thin film, was removed by means of mechanical polishing. Finally, electrodes were formed on each surface of the quartz crystal plate to form a crystal oscillator. FIG. 14 shows the electric characteristic of crystal oscillators formed in accordance with the present embodiment. As seen from FIG. 14, there was found little or no difference in the electric characteristic between a conventionally formed crystal oscillator and one formed according to the present embodiment.

EXAMPLE 11

Figure 15:
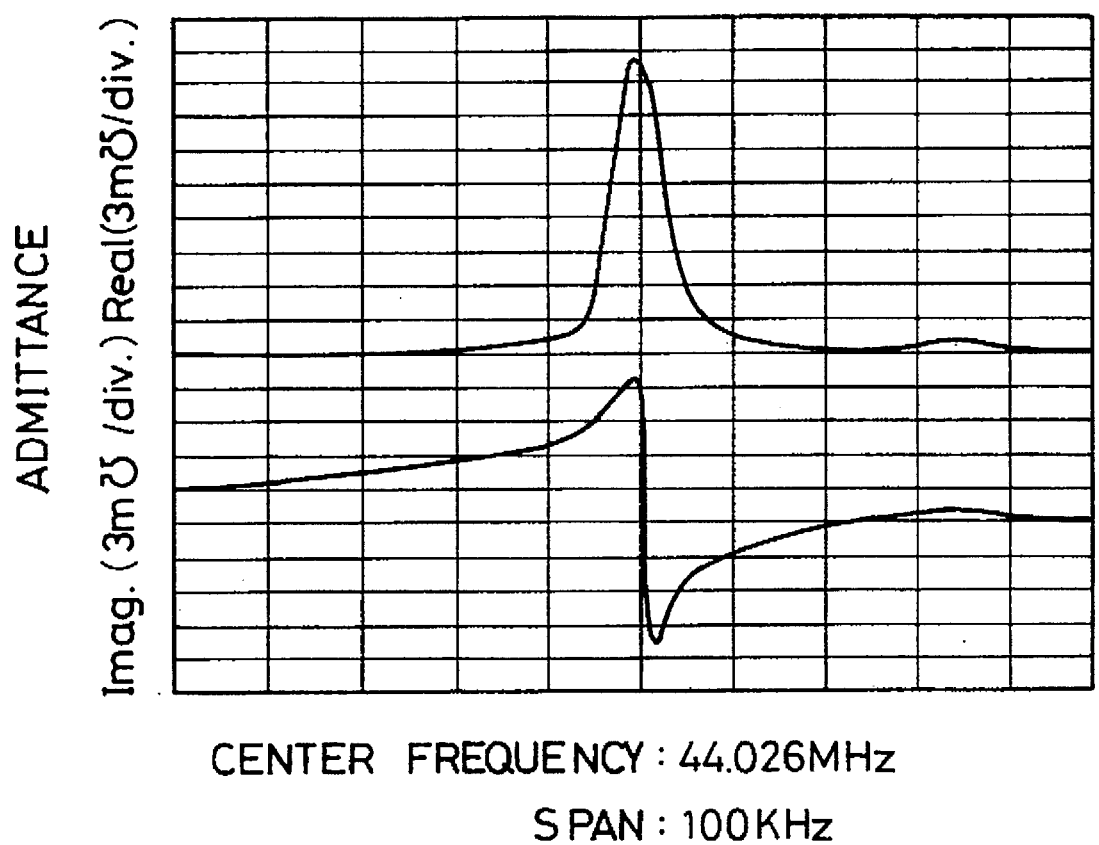
FIG. 15 is a graph showing the electric characteristic of crystal oscillators of an eleventh embodiment of the invention.

An eleventh embodiment of the invention is described. An AT-cut quartz crystal plate as a functional member and a first and a second silicon substrate were used. Processing stages of the present embodiment are almost the same as the ninth embodiment (see FIG. 12) and thus they are not schematically explained here. Firstly, a silicon dioxide ($SiO_2$) thin film having a thickness of 0.5 µm was formed on the first silicon substrate. Then, the quartz crystal plate and the $SiO_2$ thin film of the first silicon substrate were directly joined together through inter-atom bonding. Thereafter, the thickness adjustment of the quartz crystal plate was carried out, and the second silicon substrate and the quartz crystal plate were directly joined together through inter-atom bonding. Then, the $SiO_2$ thin film was etched away using an etchant of buffered hydrofluoric acid, whereby the first silicon substrate was removed. Finally, electrodes were formed on each surface of the quartz crystal plate to form a crystal oscillator. FIG. 15 shows the electric characteristic of crystal oscillators formed in accordance with the present embodiment. As seen from FIG. 15, there was found little or no difference in the electric characteristic between a conventionally formed crystal oscillator and one formed according to the present embodiment.

EXAMPLE 12

Figure 16:
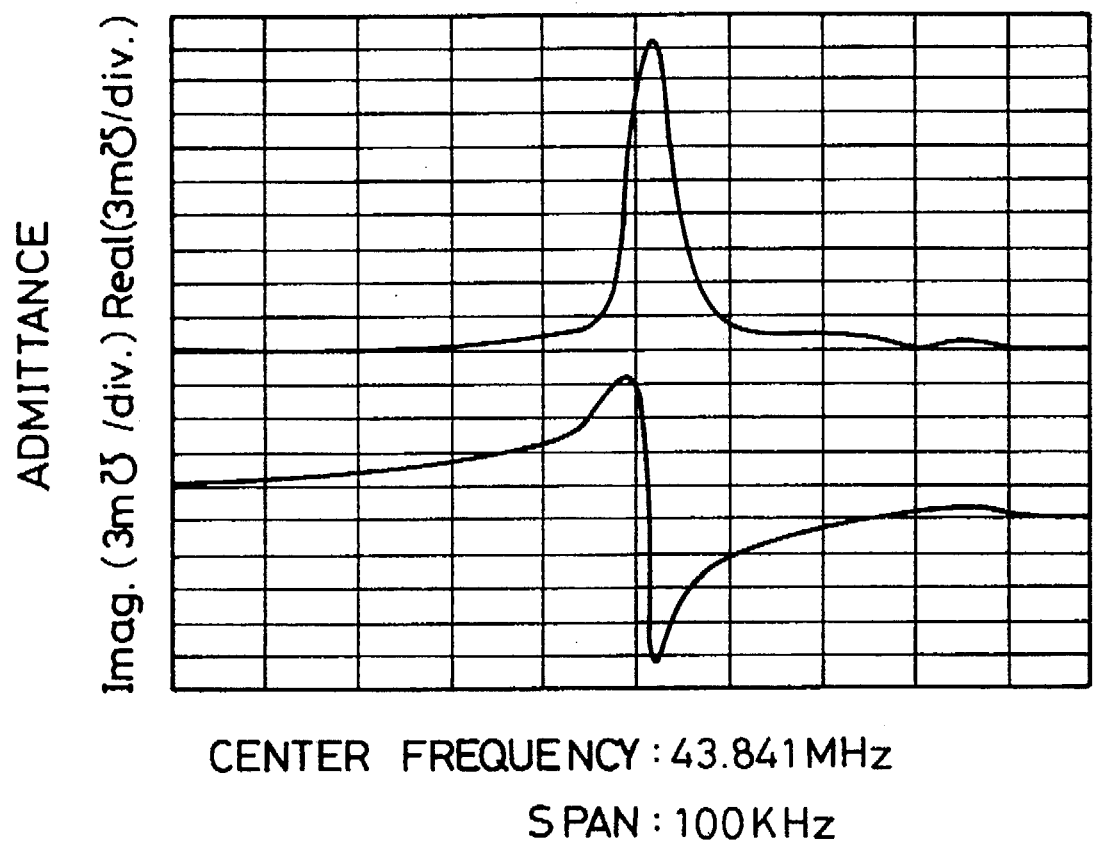
FIG. 16 is a graph showing the electric characteristic of crystal oscillators of a twelfth embodiment of the present invention.

A twelfth embodiment of the invention is described. An AT-cut quartz crystal plate as a functional member and a first and a second silicon substrate were used. Processing stages of the present embodiment are almost the same as the ninth embodiment (see FIG. 12) and thus they are not schematically explained here. Firstly, a silicon nitride ($Si_3N_4$) thin film having a thickness of 0.5 µm was formed on the first silicon substrate. Then, the quartz crystal plate and the $Si_3N_4$ thin film of the first silicon substrate were directly joined together through inter-atom bonding. Thereafter, thickness adjustment of the quartz crystal plate was carried out, and the second silicon substrate and the crystal plate were directly joined together through inter-atom bonding. Then, the $Si_3N_4$ thin film was etched away using an etchant of buffered hydrofluoric acid capable of dissolving silicon nitride but incapable of dissolving quartz or silicon, whereby the first silicon substrate was removed. Finally, electrodes were formed on each surface of the crystal plate to form a crystal oscillator. FIG. 16 shows the electric characteristic of crystal oscillators formed in accordance with the present embodiment. As seen from FIG. 16, there was found little or no difference in the electric characteristic between a conventionally formed crystal oscillator and one formed according to the present embodiment.

EXAMPLE 13

Figure 17:
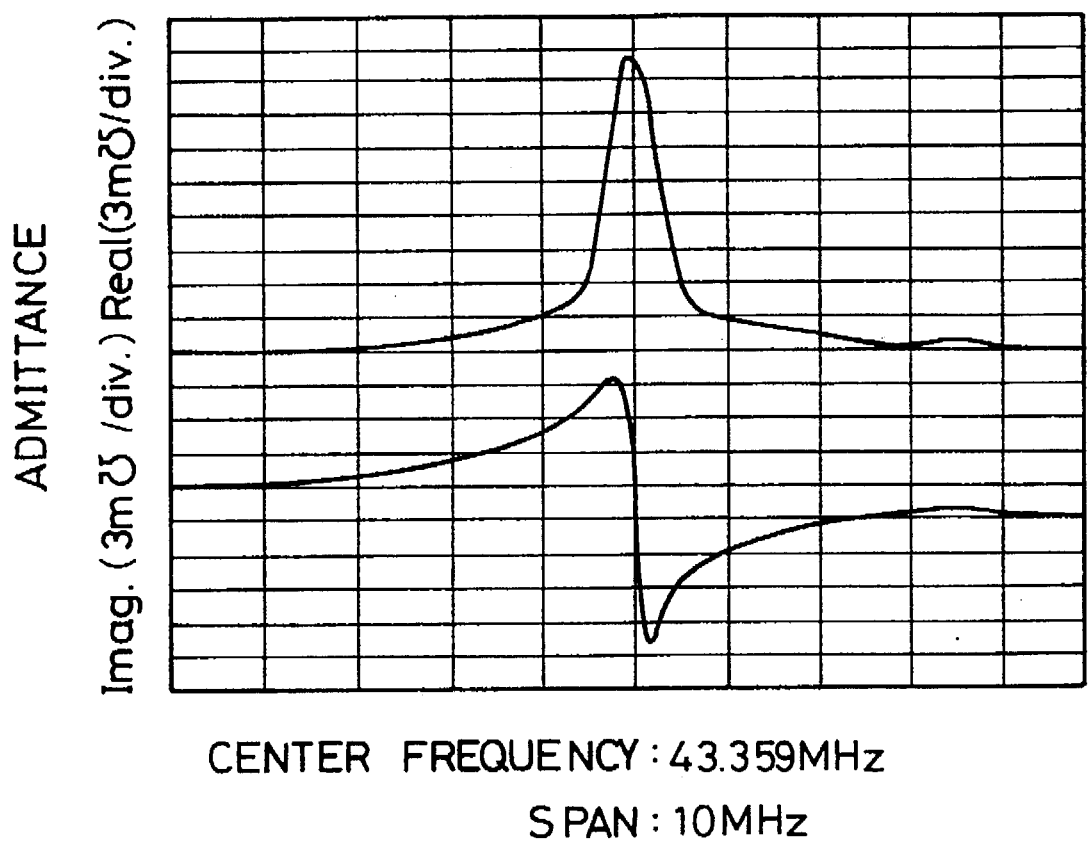
FIG. 17 is a graph showing the electric characteristic of lithium tantalate oscillators of a thirteenth embodiment of the present invention.

A thirteenth embodiment of the invention is described. A Z-cut lithium tantalate plate as a functional member and a first and a second quartz crystal substrate were used. Processing stages of the present embodiment are almost the same as the ninth embodiment (see FIG. 12) and thus they are not schematically explained here. Firstly, a $SiO_2$ thin film having a thickness of 0.5 µm was formed on the first quartz crystal substrate. Then, the lithium tantalate plate and the $SiO_2$ thin film of the first silicon substrate were directly joined together through inter-atom bonding. Thereafter, thickness adjustment of the lithium tantalate plate was carried out, and the second silicon substrate and the lithium tantalate plate were directly joined together through inter-atom bonding. Then, the $SiO_2$ thin film was etched away using an etchant of buffered hydrofluoric acid capable of dissolving silicon dioxide but incapable of dissolving lithium tantalate crystal, whereby the first silicon substrate was removed. Electrodes were formed on each surface of the lithium tantalate plate to form a crystal oscillator. FIG. 17 shows the electric characteristic of lithium tantalate crystal oscillators formed in accordance with the present embodiment. As seen from FIG. 17, there was found little or no difference in the electric characteristic between a conventionally formed lithium tantalate oscillator and one formed according to the present embodiment.

EXAMPLE 14

Figure 18:
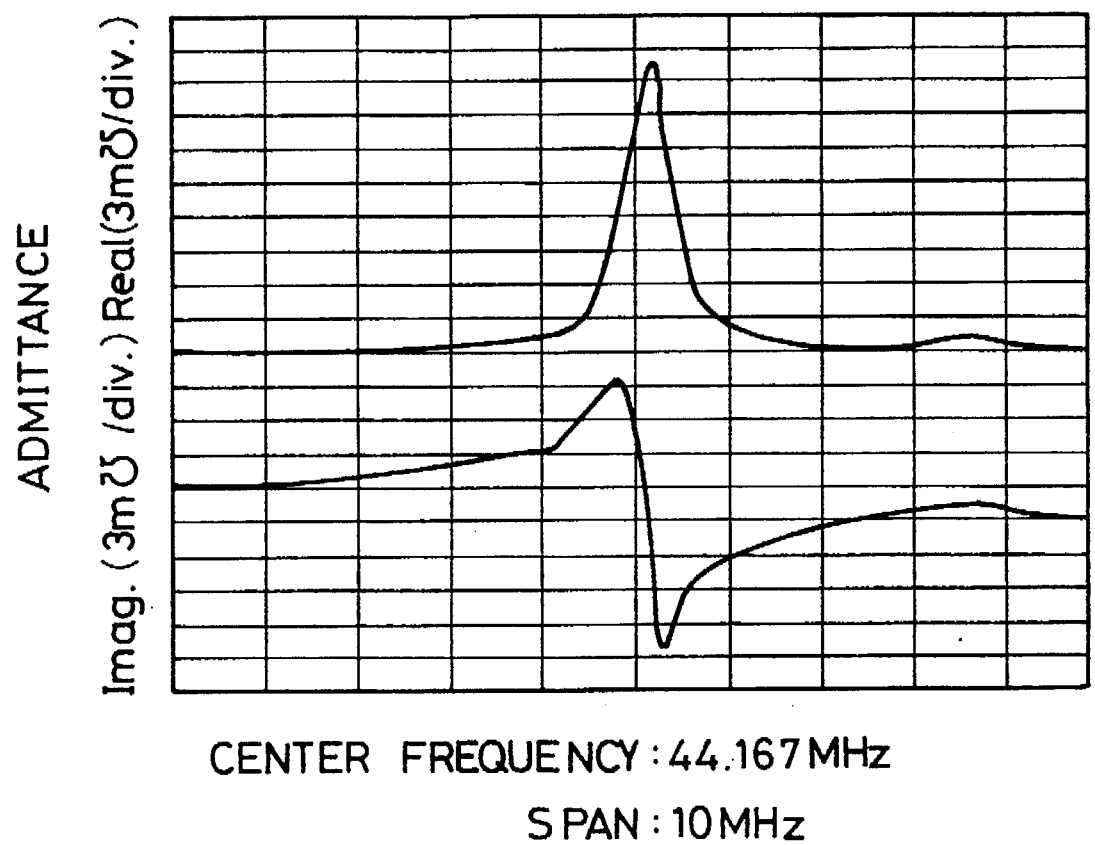
FIG. 18 is a graph showing the electric characteristic of lithium niobate oscillators of a fourteenth embodiment of the present invention.

A fourteenth embodiment of the invention is described. An X-cut lithium niobate plate as a functional member and a first and a second quartz crystal substrate were used. Processing stages of the present embodiment are almost the same as the ninth embodiment (see FIG. 12) and thus they are not schematically explained here. Firstly, a $Si_3N_4$ thin film having a thickness of 0.5 µm was formed on the first quartz crystal substrate. Then, the lithium niobate plate and the $Si_3N_4$ thin film of the first quartz crystal substrate were directly joined together through inter-atom bonding. Thereafter, thickness adjustment of the lithium niobate plate was carried out, and the second crystal substrate and the lithium niobate plate were directly joined together through inter-atom bonding. Then, the $Si_3N_4$ thin film was etched away using an etchant of buffered hydrofluoric acid capable of dissolving silicon nitride but incapable of dissolving lithium niobate or quartz crystal, whereby the first quartz crystal substrate was removed. Finally, electrodes were formed on each surface of the lithium niobate plate to form a lithium niobate oscillator. FIG. 18 shows the electric characteristic of lithium niobate oscillators of the present embodiment. As seen from FIG. 18, there was found little or no difference in the electric characteristic between a conventionally formed lithium niobate crystal oscillator and one formed according to the present embodiment.

EXAMPLE 15

Figure 19:
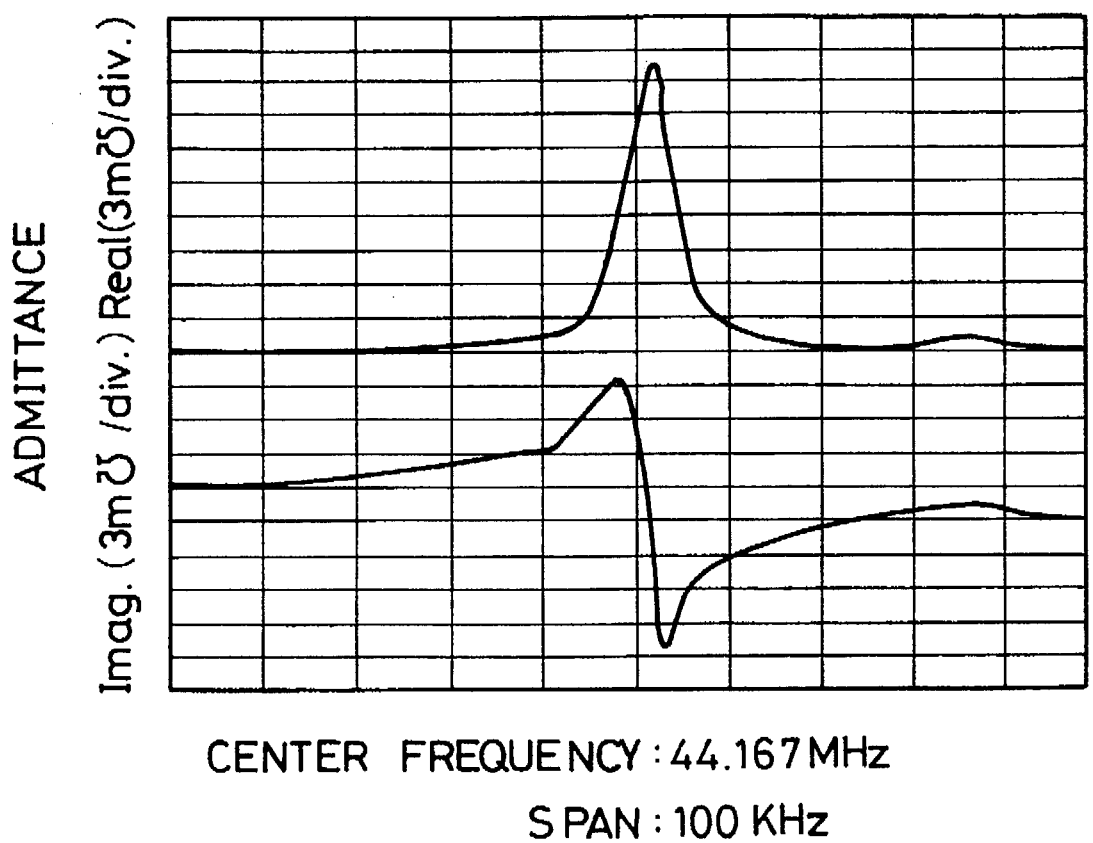
FIG. 19 is a graph showing the electric characteristic of crystal oscillators of a fifteenth embodiment of the present invention.

In a fifteen embodiment of the invention, an AT-cut quartz crystal plate as a functional member and a first and a second silicon substrate were used. Processing stages of the present embodiment are almost the same as the ninth embodiment (see FIG. 12) and thus they are not schematically explained here. Firstly, a $SiO_2$ thin film having a thickness of 0.5 µm was formed on the first silicon substrate. Then, the quartz crystal plate and the $SiO_2$ thin film of the first silicon substrate were directly joined together through inter-atom bonding. Thereafter, thickness adjustment of the quartz crystal plate was carried out, and the second silicon substrate and the quartz crystal plate were directly joined together through inter-atom bonding. Then, the $SiO_2$ thin film was etched away using an etchant of buffered hydrofluoric acid capable of dissolving silicon dioxide but incapable of dissolving quartz crystal, whereby the first silicon substrate was removed. An opening was already formed, such as by a chemical technique (e.g., etching) or by a mechanical technique (e.g., sandblasting), in the second silicon substrate where an underside electrode of an oscillator was to be formed. Electrodes were formed on each surface of the quartz crystal plate to form a crystal oscillator. FIG. 19 shows the electric characteristic of quartz crystal oscillators of the present embodiment. As seen from FIG. 19, there was found little or no difference in the electric characteristic between a conventionally formed quartz crystal oscillator and one formed according to the present embodiment.

In the eighth to fifteenth embodiments, quartz crystal, silicon, or glass is used to form substrates. Other functionally equivalent ceramic materials may be useful. Further, the thin film is formed by silicon, silicon dioxide, or silicon nitride. Titanium oxide may be useful. As a functional member, quartz crystal, lithium tantalate, and lithium niobate are used. Other functionally equivalent materials such as piezoelectrics including lithium borate, PZT, and PLZT and magnetic materials including ferrite may be useful. The combination of these materials is not limited to the above. Any combination that enables direct bonding may be useful.

Further, the film thickness of the thin film is 0.5 µm, however, any film thickness may be possible as long as direct bonding is accomplished.

EXAMPLE 16

Figure 20:
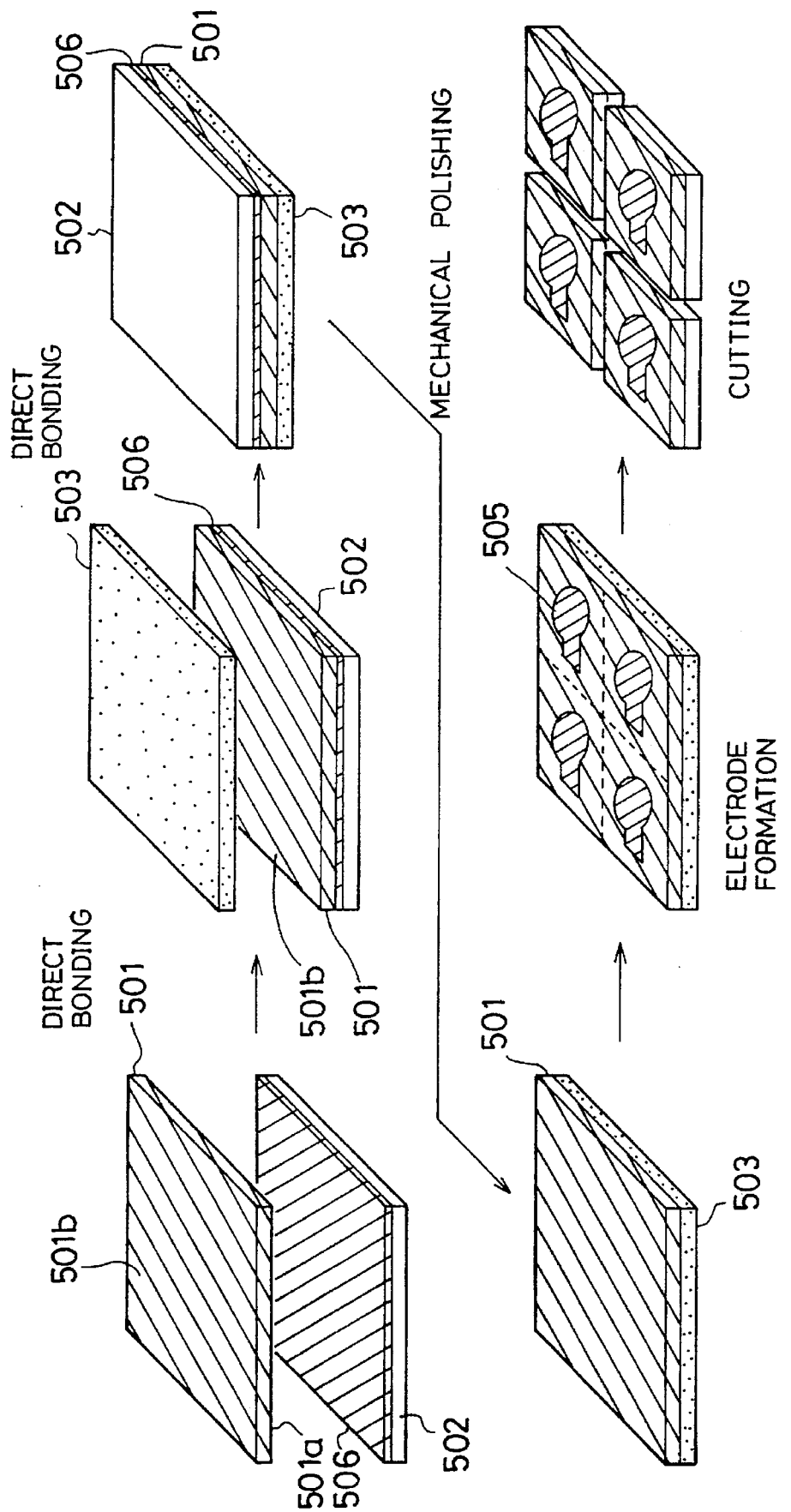
FIG. 20 shows successive stages of the processing of crystal oscillators of a sixteenth embodiment of the present invention.

A sixteenth embodiment of the invention is described by making reference to FIG. 20. For the sake of convenience, each of the foregoing embodiments shows an example in which discreet electronic components are processed. In contrast, the present embodiment shows an example in which a great number of electronic components are first formed on a sheet-like plate, electrodes are formed, and the plate is cut to individual electronic components. In the present embodiment, an AT-cut quartz crystal plate 501 as a functional member, a first silicon substrate 502 (i.e., the first substrate) and a second silicon substrate 503 (i.e., the second substrate) were used. From the quartz crystal plate 501 a great number of piezoelectric devices are cut;, however, for the sake of easy understanding, the quartz crystal plate 501 of FIG. 20 carries thereon only four piezoelectric devices. In the first place, a $SiO_2$ thin film 506 is deposited 0.5 µm on the first silicon substrate 502. Inter-atom bonding was created between a first flat surface 501a of the quartz crystal plate 501 and the $SiO_2$ thin film 506, and the quartz crystal plate 501 and the $SiO_2$ thin film 506 were directly joined together. Then, inter-atom bonding was created between a second flat surface 501b of the quartz crystal plate 501 and one surface of the second silicon substrate 503, and the quartz crystal plate 501 and the second silicon substrate 503 were directly joined together. Next, the first silicon substrate 502 and the $SiO_2$ thin film 506 were removed by means of a mechanical polishing technique. Electrodes 505 for respective piezoelectric devices were formed on each surface of the quartz crystal plate 501. The quartz crystal plate 501 was divided, such as by means of a laser trimming technique, into individual piezoelectric devices. The frequency characteristic of crystal oscillators obtained by the present embodiment is the same as the frequency characteristic of crystal oscillators of the fifteenth embodiment.

In each of the foregoing embodiments, the functional member and the first substrate are directly joined together through inter-atom bonding. Unlike a technique employing adhesive agents for establishing bonding, original plane accuracy of a functional member can be utilized in the present invention, since there is provided nothing that causes variations in thickness between the functional member and the first substrate. Therefore, if the degree of plane accuracy of the functional member is good, a surface of the functional member joined to the first substrate is almost flat. This eliminates the need for a special technique in transferring the functionality member onto the second substrate and thus high-accuracy processing can be realized.

In the first, third, and eighth embodiments, the functional member and the second substrate are joined together by an adhesive agent after direct bonding of the functional member and the first substrate is carried out. Generally, at the time of adhesion, an adhesive agent is in the viscosity and elasticity state, and if the degree of viscosity is not constant due to variations in adhesive agent component and due to variations in temperature, this causes resistance, applied to members to be joined from the adhesive agent, to be non-uniform. As a result, local unevenness occurs to the surfaces of the members to be joined. In the bonding step in which an adhesive agent is used, the functional member and the first substrate are directly joined together so that the functional member is reinforced. Additionally, since the second flat surface of the functional member is almost flat, the functional member suffers from little or no local unevenness and the thickness of an adhesive agent layer becomes almost uniform. Therefore, even when thinning functional members, it is possible to improve the degree of thickness accuracy. Additionally, it is possible to accomplish high frequency accuracy with a piezoelectric device having a thickness of ten odd micrometers.

Further, as described in each embodiment, the functional member is directly joined to the first substrate, and before transferring the functional member to the second substrate from the first substrate the functional member is adjusted in thickness. This produces the advantage that the thickness of the functional member becomes more uniform.

In each of the foregoing embodiments, techniques used to process electrodes are not specified. Any techniques known in the art may be useful, such as vacuum deposition, sputtering, and CVD.

In each of the foregoing embodiments, electronic components are formed, with the second substrate firmly fixed to the functional member; however, the second substrate may be removed. In such a case, it is preferable that the functional member and the second substrate are bonded together with an adhesive.

In each of the foregoing embodiments, when removing the first substrate, either a mechanical polishing or a chemical treatment is carried out. It is possible to first perform a mechanical polishing and then a chemical treatment such as etching and mechanochemical polishing so as to remove a degenerated layer as a result of such a mechanical polishing.

In the second, fourth to seventh, and ninth to fifteenth embodiments, the functional member and the second substrate are directly joined together through inter-atom bonding. Therefore, at the time when the first substrate is removed to form an electronic component, the functional member is held by direct bonding. This enables the formation of electronic elements that are solid and superior in vibration and heat resistance.

Further, in the fourth, seventh, and fifteenth embodiments, the second substrate and the functional member have the same thermal expansion coefficient. As a result of such arrangement, even when the temperature changes, thermal stress due to a difference in thermal expansion coefficient is suppressed. This enables the formation of electronic components with a high stability against heat processing and environmental changes.

In the first, fourth, eighth, and tenth to fifteenth embodiments, the first and second substrates are formed by the same material so that they have the same thermal expansion coefficient. As a result of such an arrangement, the functional member is disposed between these substrates having the same thermal expansion coefficient. This prevents the occurrence of warping due to thermal stress, thereby facilitating thermal processing.

Furthermore, the sixteenth embodiment makes it possible to accomplish mass production and thus cut down the cost of processing.

Each of the first to sixteenth embodiments may find applications in crystal filters.

Further, each of the embodiments may find applications in various electronic components that require very thin films such as magnetic devices formed such as by ferrite and devices for video camera tubes.

The invention claimed is:

1. A method of processing a piezoelectric device comprising the steps of:
    (a) joining a functional member composed of a piezoelectric material and a first substrate together by creating an inter-atom bond such that a strong covalent bond is formed between a first flat surface of said functional member and one surface of said first substrate, said inter-atom bond created by polishing said first flat surface and said one flat surface of said first substrate, subjecting said surfaces to a hydrophiliticization treatment, and heating,
    (b) fixing a second substrate to a second flat surface of said functional member, and
    (c) removing said first substrate from said first flat surface of said functional member by mechanical polishing or chemical processing, with said functional member and said second substrate being joined together.

2. A method of processing a piezoelectric device as in claim 1 further including a step of adjusting the thickness of said functional member by removing a part of said functional member after said joining step but before said fixing step.

3. A method of processing a piezoelectric device as in claim 1 wherein in said fixing step said second substrate is fixed to said functional member by creating an inter-atom bond between surfaces of said second substrate and said functional member to be contacted with each other.

4. A method of processing a piezoelectric device as in claim 1, wherein said piezoelectric material is composed of quartz crystal, lithium tantalate, lithium niobate, lithium borate, lead zirconate titanate, or lead lanthanum zirconate titanate.

5. A method of processing a piezoelectric device as in claim 1, wherein said first substrate is composed of glass or silicon.

6. A method of processing a piezoelectric device as in claim 1, wherein said second substrate is composed of the same material as said first substrate.

7. A method of processing a piezoelectric device as in claim 1, wherein said second substrate is composed of the same material as said functional member.

8. A method of processing a piezoelectric device as in claim 1, wherein said second substrate is composed of quartz crystal, lithium tantalate, lithium niobate, lithium borate, lead zirconate titanate, lead lanthanum zirconate titanate glass, or silicon.

9. A method of processing a piezoelectric device comprising the steps of:

(a) forming a thin film of uniform thickness on a surface of a first substrate, (b) joining a functional member and said first substrate together by creating an inter-atom bond such that a strong covalent bond is formed between a first flat surface of said functional member and said surface of said first substrate, which is provided with said thin film, said inter-atom bond created by polishing said first flat surface and said one flat surface of said first substrate, subjecting said surfaces to a hydrophilitici-zation treatment, and heating at a high temperature, (c) fixing a second substrate to a second flat surface of said functional member, and (d) removing said first substrate from said functional member, with said second substrate being fixed to said functional member.

10. A method of processing a piezoelectric device as in claim 9 further including a step of adjusting the thickness of said functional member by removing a part of said functional member after said joining step but before said fixing step.

11. A method of processing a piezoelectric device as in claim 9 wherein in said fixing step said second substrate is fixed to said functional member by creating an inter-atom bond between surfaces of said second substrate and said functional member to be contacted with each other.

12. A method of processing a piezoelectric device as in claim 9, wherein in said removing step said first substrate is removed by etching said thin film.

13. A method of processing a piezoelectric device as in claim 9 wherein in said removing step said first substrate is removed either by means of mechanical polishing or by means of chemical processing.

14. A method of processing a piezoelectric device as in claim 9 wherein said functional member is composed of a piezoelectric material.

15. A method of processing a piezoelectric device as in claim 9, wherein said functional member is composed of a piezoelectric material, said piezoelectric material is composed of quartz crystal, lithium tantalate, lithium niobate, lithium borate, lead zirconate titanate, or lead lanthanum zirconate titanate.

16. A method of processing a piezoelectric device as in claim 9, wherein said first substrate is composed of quartz crystal, lithium tantalate, lithium niobate, lithium borate, lead zirconate titanate, lead lanthanum zirconate titanate, glass, or silicon.

17. A method of processing a piezoelectric device as in claim 9, wherein said second substrate is composed of the same material as said first substrate.

18. A method of processing a piezoelectric device as in claim 9, wherein said second substrate is composed of the same material as said functional member.

19. A method of processing a piezoelectric device as in claim 9, wherein said second substrate is composed of quartz crystal, lithium tantalate, lithium niobate, lithium borate, lead zirconate titanate, lead lanthanum zirconate titanate, glass, or silicon.

20. A method of processing a piezoelectric device as in claim 9, wherein said thin film is composed of silicon or silicon dioxide.

21. A method of processing a piezoelectric device as in either claim 1 or claim 9, wherein said bonding of said functional member and said first substrate through inter-atom bonding is performed by subjecting surfaces of said functional member and said first substrate to be contacted with each other to a hydrophilicitization treatment and then to an ultraviolet illumination treatment.

22. A method of processing a piezoelectric device as in either claim 1 or claim 9 further including a step of performing a piezoelectric device subdivision with the functional member and the second substrate being joined together, after all the steps have been completed.

23. A method of processing a piezoelectric device as in either claim 1 or claim 9, wherein in said fixing step said second substrate is fixed to said functional member with an adhesive agent and said method further includes a step of separating said second substrate from said functional member after all of said steps have been completed.

24. A method of processing a piezoelectric device comprising the steps of:

(a) joining a functional member composed of a piezoelectric material and a first substrate together by creating an inter-atom bond such that a strong covalent bond is formed between a first flat surface of said functional member and one surface of said first substrate, (b) fixing a second substrate to a second flat surface of said functional member, and (c) removing said first substrate from said first flat surface of said functional member, with said functional member and said second substrate being joined together and said first substrate being destroyed when removed.

* * * * *